(12) United States Patent
Zhang et al.

(10) Patent No.: US 7,622,335 B2
(45) Date of Patent: *Nov. 24, 2009

(54) METHOD FOR MANUFACTURING A THIN FILM TRANSISTOR DEVICE

(75) Inventors: Hongyong Zhang, Kanagawa (JP); Hideki Uochi, Kanagawa (JP); Toru Takayama, Kanagawa (JP); Takeshi Fukunaga, Kanagawa (JP); Yasuhiko Takemura, Shiga (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/926,059

(22) Filed: Aug. 26, 2004

(65) Prior Publication Data

US 2005/0020006 A1    Jan. 27, 2005

Related U.S. Application Data

(62) Division of application No. 09/993,492, filed on Nov. 27, 2001, now Pat. No. 6,806,125, which is a division of application No. 09/439,997, filed on Nov. 15, 1999, now Pat. No. 6,338,991, which is a division of application No. 09/233,146, filed on Jan. 19, 1999, now Pat. No. 6,323,071, which is a division of application No. 08/661,013, filed on Jun. 10, 1996, now Pat. No. 5,888,857, which is a division of application No. 08/341,106, filed on Nov. 18, 1994, now Pat. No. 5,563,426, which is a division of application No. 08/160,908, filed on Dec. 3, 1993, now Pat. No. 5,403,772.

(30) Foreign Application Priority Data

| Dec. 4, 1992 | (JP) | ................................. 4-350545 |
| Jul. 27, 1993 | (JP) | ................................. 5-204775 |
| Nov. 4, 1993 | (JP) | ................................. 5-298944 |

(51) Int. Cl.
*H01L 21/00* (2006.01)
(52) U.S. Cl. ............................... 438/149; 257/E29.151
(58) Field of Classification Search ......... 438/149–167, 438/FOR. 184, FOR. 273; 257/E51.005, 257/E29.273, E29.151; 345/92
See application file for complete search history.

(56) References Cited

U.S. PATENT DOCUMENTS 4,198,246 A    4/1980  Wu (Continued)

FOREIGN PATENT DOCUMENTS

CN    87103446    12/1987

(Continued)

OTHER PUBLICATIONS

Hempel et al., "Needle-Like Crystallization of Ni Doped Amorphous Silicon Thin Films", pp. 921-924, 1993, Solid State Communications, vol. 85, No. 11.

(Continued)

*Primary Examiner*—Brook Kebede
(74) *Attorney, Agent, or Firm*—Nixon Peabody LLP; Jeffrey L. Costellia

(57) ABSTRACT

A method for manufacturing a semiconductor device such as a thin film transistor using a crystal silicon film is provided. The crystal silicon film is obtained by selectively forming films, particles or clusters containing nickel, iron, cobalt, ruthenium, rhodium, paradium, osmium, iridium, platinum, scandium, titanium, vanadium, chrome, manganese, copper, zinc, gold, silver or silicide thereof in a form of island, line, stripe, dot or film on or under an amorphous silicon film and using them as a starting point, by advancing its crystallization by annealing at a temperature lower than a normal crystallization temperature of an amorphous silicon. A transistor whose leak current is low and a transistor in which a mobility is high are obtained in the same time in structuring a dynamic circuit having a thin film transistor by selectively forming a cover film on a semiconductor layer which is to become an active layer of the transistor and by thermally crystallizing it thereafter.

24 Claims, 9 Drawing Sheets

U.S. PATENT DOCUMENTS

| | | | |
|---|---|---|---|
| 4,276,688 A | 7/1981 | Hsu | |
| 4,331,485 A | 5/1982 | Gat | |
| 4,351,856 A | 9/1982 | Matsui et al. | |
| 4,394,191 A | 7/1983 | Wada et al. | |
| 4,399,605 A | 8/1983 | Dash et al. | |
| 4,482,395 A | 11/1984 | Hiramoto | |
| 4,507,846 A | 4/1985 | Ohno | |
| 4,534,820 A | 8/1985 | Mori et al. | |
| 4,536,251 A | 8/1985 | Chiang et al. | |
| 4,582,395 A | 4/1986 | Morozumi | |
| 4,654,959 A | 4/1987 | Takafuji et al. | |
| 4,680,609 A * | 7/1987 | Calder et al. | 257/69 |
| 4,693,759 A | 9/1987 | Noguchi et al. | |
| 4,727,044 A | 2/1988 | Yamazaki | |
| 4,741,601 A | 5/1988 | Saito | |
| 4,778,258 A | 10/1988 | Parks et al. | |
| 4,829,359 A * | 5/1989 | O et al. | 257/374 |
| 4,847,211 A | 7/1989 | Lee | |
| 4,951,113 A | 8/1990 | Huang et al. | |
| 4,963,503 A | 10/1990 | Aoki et al. | |
| 5,009,872 A | 4/1991 | Chuang et al. | |
| 5,032,531 A | 7/1991 | Tsutsui et al. | |
| 5,064,775 A | 11/1991 | Chang | |
| 5,112,764 A | 5/1992 | Mitra et al. | |
| 5,147,826 A | 9/1992 | Liu et al. | |
| 5,200,846 A | 4/1993 | Hiroki et al. | |
| 5,202,274 A | 4/1993 | Bae et al. | |
| 5,219,786 A | 6/1993 | Noguchi | |
| 5,231,039 A | 7/1993 | Sakono et al. | |
| 5,250,931 A | 10/1993 | Misawa et al. | |
| 5,262,654 A | 11/1993 | Yamazaki | |
| 5,272,361 A | 12/1993 | Yamazaki | |
| 5,274,279 A | 12/1993 | Misawa et al. | |
| 5,275,851 A | 1/1994 | Fonash et al. | |
| 5,278,093 A | 1/1994 | Yonehara | |
| 5,287,205 A | 2/1994 | Yamazaki et al. | |
| 5,289,030 A | 2/1994 | Yamazaki et al. | |
| 5,292,675 A | 3/1994 | Codama | |
| 5,294,555 A | 3/1994 | Mano et al. | |
| 5,296,405 A | 3/1994 | Yamazaki et al. | |
| 5,298,455 A | 3/1994 | Arai et al. | |
| 5,300,187 A | 4/1994 | Lesk et al. | |
| 5,300,449 A * | 4/1994 | Okumura | 438/161 |
| 5,306,651 A | 4/1994 | Masumo et al. | |
| 5,308,998 A | 5/1994 | Yamazaki et al. | |
| 5,313,076 A | 5/1994 | Yamazaki et al. | |
| 5,316,960 A | 5/1994 | Watanabe et al. | |
| 5,317,432 A | 5/1994 | Ino | |
| 5,318,661 A | 6/1994 | Kumomi | |
| 5,318,919 A | 6/1994 | Noguchi et al. | |
| 5,320,973 A | 6/1994 | Kobayashi | |
| 5,323,042 A | 6/1994 | Matsumoto | |
| 5,326,712 A | 7/1994 | Bae | |
| 5,341,012 A | 8/1994 | Misawa et al. | |
| 5,352,291 A | 10/1994 | Zhang et al. | |
| 5,366,922 A | 11/1994 | Aoki et al. | |
| 5,373,803 A | 12/1994 | Noguchi et al. | |
| 5,397,718 A | 3/1995 | Furuta et al. | |
| 5,403,762 A | 4/1995 | Takemura | |
| 5,403,772 A | 4/1995 | Zhang et al. | |
| 5,426,064 A | 6/1995 | Zhang et al. | |
| 5,442,198 A | 8/1995 | Arai et al. | |
| 5,481,121 A | 1/1996 | Zhang et al. | |
| 5,488,000 A | 1/1996 | Zhang et al. | |
| 5,492,843 A | 2/1996 | Adachi et al. | |
| 5,501,989 A | 3/1996 | Takayama et al. | |
| 5,508,533 A | 4/1996 | Takemura | |
| 5,523,257 A | 6/1996 | Yamazaki et al. | |
| 5,529,937 A | 6/1996 | Zhang et al. | |
| 5,531,182 A | 7/1996 | Yonehara | |
| 5,534,716 A | 7/1996 | Takemura | |
| 5,543,352 A | 8/1996 | Ohtani et al. | |
| 5,563,426 A | 10/1996 | Zhang et al. | |
| 5,569,610 A | 10/1996 | Zhang et al. | |
| 5,569,936 A | 10/1996 | Zhang et al. | |
| 5,572,046 A | 11/1996 | Takemura | |
| 5,580,792 A | 12/1996 | Zhang et al. | |
| 5,583,347 A | 12/1996 | Misawa et al. | |
| 5,585,291 A | 12/1996 | Ohtani et al. | |
| 5,589,694 A | 12/1996 | Takayama et al. | |
| 5,591,990 A | 1/1997 | Misawa et al. | |
| 5,595,923 A | 1/1997 | Zhang et al. | |
| 5,595,944 A | 1/1997 | Zhang et al. | |
| 5,604,360 A | 2/1997 | Zhang et al. | |
| 5,605,846 A | 2/1997 | Ohtani et al. | |
| 5,606,179 A | 2/1997 | Yamazaki et al. | |
| 5,608,232 A | 3/1997 | Yamazaki et al. | |
| 5,612,250 A | 3/1997 | Ohtani et al. | |
| 5,614,426 A | 3/1997 | Funada et al. | |
| 5,614,733 A | 3/1997 | Zhang et al. | |
| 5,616,506 A | 4/1997 | Takemura | |
| 5,616,936 A | 4/1997 | Misawa et al. | |
| 5,620,910 A | 4/1997 | Teramoto | |
| 5,621,224 A | 4/1997 | Yamazaki et al. | |
| 5,624,851 A | 4/1997 | Takayama et al. | |
| 5,637,515 A | 6/1997 | Takemura | |
| 5,639,698 A | 6/1997 | Yamazaki et al. | |
| 5,643,826 A | 7/1997 | Ohtani et al. | |
| 5,646,424 A | 7/1997 | Zhang et al. | |
| 5,648,685 A | 7/1997 | Misawa et al. | |
| 5,654,203 A | 8/1997 | Ohtani et al. | |
| 5,656,825 A | 8/1997 | Kusumoto et al. | |
| 5,656,826 A | 8/1997 | Misawa et al. | |
| 5,663,077 A | 9/1997 | Adachi et al. | |
| 5,677,212 A | 10/1997 | Misawa et al. | |
| 5,677,240 A | 10/1997 | Murakami et al. | |
| 5,677,549 A | 10/1997 | Takayama et al. | |
| 5,696,386 A | 12/1997 | Yamazaki | |
| 5,696,388 A | 12/1997 | Funada et al. | |
| 5,700,333 A | 12/1997 | Yamazaki et al. | |
| 5,705,829 A | 1/1998 | Miyanaga et al. | |
| 5,712,191 A | 1/1998 | Nakajima et al. | |
| 5,714,771 A | 2/1998 | Misawa et al. | |
| 5,754,158 A | 5/1998 | Misawa et al. | |
| 5,756,364 A | 5/1998 | Tanaka et al. | |
| 5,780,872 A | 7/1998 | Misawa et al. | |
| 5,804,471 A | 9/1998 | Yamazaki et al. | |
| 5,811,837 A | 9/1998 | Misawa et al. | |
| 5,869,363 A | 2/1999 | Yamazaki et al. | |
| 5,888,857 A | 3/1999 | Zhang | |
| 5,888,858 A | 3/1999 | Yamazaki et al. | |
| 5,897,347 A | 4/1999 | Yamazaki et al. | |
| 5,904,511 A | 5/1999 | Misawa et al. | |
| 5,962,869 A | 10/1999 | Yamazaki et al. | |
| 5,985,740 A | 11/1999 | Yamazaki et al. | |
| 6,177,302 B1 | 1/2001 | Yamazaki et al. | |
| 6,261,877 B1 | 7/2001 | Yamazaki et al. | |
| 6,271,066 B1 | 8/2001 | Yamazaki et al. | |
| 6,423,586 B1 | 7/2002 | Yamazaki et al. | |
| 6,486,495 B2 | 11/2002 | Zhang | |
| 6,486,497 B2 | 11/2002 | Misawa et al. | |
| 6,700,135 B2 | 3/2004 | Misawa et al. | |
| 7,056,775 B2 * | 6/2006 | Zhang et al. | 438/154 |

FOREIGN PATENT DOCUMENTS

| | | |
|---|---|---|
| EP | 0246031 | 11/1987 |
| EP | 0342925 A2 | 11/1989 |
| EP | 0 390 608 | 10/1990 |
| EP | 0481777 | 4/1992 |
| EP | 0497592 A2 | 8/1992 |
| EP | 0609919 A2 | 8/1994 |
| EP | 0610969 A2 | 8/1994 |
| EP | 0617309 A1 | 9/1994 |

| | | | |
|---|---|---|---|
| EP | 0806700 | A1 | 11/1997 |
| EP | 0806701 | A1 | 11/1997 |
| EP | 0806702 | A1 | 11/1997 |
| EP | 1227469 | A2 | 7/2002 |
| GB | 2 171 844 | A | 9/1986 |
| JP | 44-015736 | | 7/1969 |
| JP | 45-022173 | | 7/1970 |
| JP | 58-040820 | | 3/1983 |
| JP | 58-052843 | | 3/1983 |
| JP | 58-068923 | | 4/1983 |
| JP | 60-105216 | | 6/1985 |
| JP | 60-154660 | | 8/1985 |
| JP | 61-030023 | | 2/1986 |
| JP | 61-063017 | | 4/1986 |
| JP | 61-166528 | | 10/1986 |
| JP | 61-234027 | | 10/1986 |
| JP | 61-253855 | | 11/1986 |
| JP | 62-169467 | | 7/1987 |
| JP | 62169467 | A * | 7/1987 |
| JP | 62-298151 | | 12/1987 |
| JP | 63-056912 | | 3/1988 |
| JP | 63-142807 | | 6/1988 |
| JP | 63142849 | A * | 6/1988 |
| JP | 63-194326 | | 8/1988 |
| JP | 63-283013 | | 11/1988 |
| JP | 64-015981 | | 1/1989 |
| JP | 01-187814 | | 7/1989 |
| JP | 01-212431 | | 8/1989 |
| JP | 1-214110 | | 8/1989 |
| JP | 01-270309 | | 10/1989 |
| JP | 01-289917 | | 11/1989 |
| JP | 02-027320 | | 1/1990 |
| JP | 02-033934 | | 2/1990 |
| JP | 02-094519 | | 4/1990 |
| JP | 02-140915 | | 5/1990 |
| JP | 02-202028 | | 8/1990 |
| JP | 02-228043 | | 9/1990 |
| JP | 02-260524 | | 10/1990 |
| JP | 03-011618 | | 1/1991 |
| JP | 03-042868 | | 2/1991 |
| JP | 04-152624 | | 5/1992 |
| JP | 04-186734 | | 7/1992 |
| JP | 04-195123 | | 7/1992 |
| JP | 04-206836 | | 7/1992 |
| JP | 04-206837 | | 7/1992 |
| JP | 04-245443 | | 9/1992 |
| JP | 04-260336 | | 9/1992 |
| JP | 04-290467 | | 10/1992 |
| JP | 04-318938 | | 11/1992 |
| JP | 04-359562 | | 12/1992 |
| JP | 04-362616 | | 12/1992 |
| JP | 05-003321 | | 1/1993 |
| JP | 05-013442 | | 1/1993 |
| JP | 05-218428 | | 8/1993 |
| JP | 05-335334 | | 12/1993 |

OTHER PUBLICATIONS

Dvurechenskii et al., "Transport Phenomena in Amorphous Silicon Doped by Ion Implantation of 3d Metals", pp. 635-640, 1986, Akademikian Lavrentev Prospekt 13, 630090 Novosibirsk 90, USSR.

Wolf et al., "Silicon Processing for the VLSI Era", pp. 308-309, 1986, VLSI, vol. 1.

Morozumi, "1985 International Display Research Conference, Active Matrix Addressed Liquid-Crystal Displays", pp. 9-13, 1985, IEEE, CH 2239-2/85/0000-0009.

Kawachi et al., "Large-Area Doping Process for Fabrication of Poly-Si Thin Film Transistors Using Bucket Ion Source and XeCl Excimer Laser Annealing", pp. L2370-L2371, Dec. 1990, Jpn J. Appl. Phys. 29(12) L2370.

Tokuyama et al., (title unknown), pp. 253, 1989, VLSI (in Japanese).

Hayzelden et al., "In Situ Transmission Electron Microscopy Studies of Silicide-Mediated Crystallization of Amorphous Silicon", pp. 225-227, 1992, Appl Phys. Lett., 60(2).

Wolf et al., "Silicon Processing for the VLSI Era", pp. 176-177, 1986, Lattice Press, vol. 1.

Liu et al., "Polycrystalline Silicon Thin Film Transistors on Corning 7059 Glass Substrates Using Short Time, Low-Temperature Processing", pp. 2554-2556, May 17, 1993, Appl. Phys. Lett. 62 (20).

Hirano et al., "Low Temperature Activation Method of Poly-Si Films Using Rapid Thermal Annealing", pp. 119-126, 1997, Microelectronics Research Center, Sanyo Electric Co., Ltd., SPIE vol. 3014.

Kugimiya et al, "CW Laser Annealing of Polycrystalline Silicon on SiO2 and Effects of Successive Furnace Annealing", Jan. 1992, pp. L19-L21, Jpn. J. Appl. Phys. vol. 21, No. 1.

Wolf et al., "Silicon Processing for the VLSI Era", 1986, pp. 176-177, Lattice Press, vol. 1: Process Technology.

Thompson et al., "Silicide Formation in Pd-a-Si:H Schottky Barriers", pp. 274-276, Aug. 1981, Appl Phys. Lett., vol. 39, No. 3.

Nemanich et al., "Initial Phase Formation at the Interface of Ni, Pd, or Pt and Si", 1984, Mat. Res. Soc. Symp. Proc., vol. 25.

Nemanich et al., "Structure and Growth of the Interface of Pd on a-SiH", pp. 6828-6831, Jun. 15, 1981, The American Physical Society Physica Review, vol. 22, No. 12.

Si-Yuan et al., "Annealing properties of Au-doped and undoped Si-SiO$_2$ interfaces in dry oxygen," Acta Physica Sinica, 1985, vol. 34, No. 6, pp. 715-724.

Office Action (Application No. 200410069654.6; CN2219/../ 2526D1D2D1 dated Nov. 23, 2007.

* cited by examiner

FIG. 2(A-1)
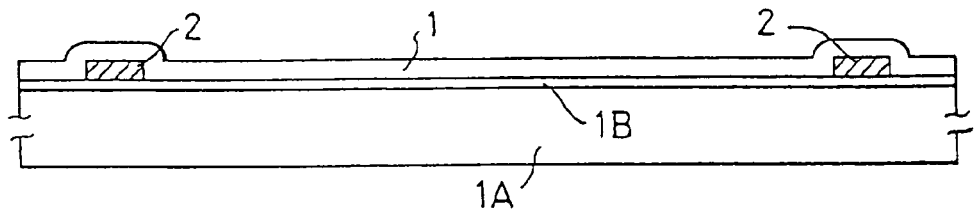
FIG. 2(A-2)
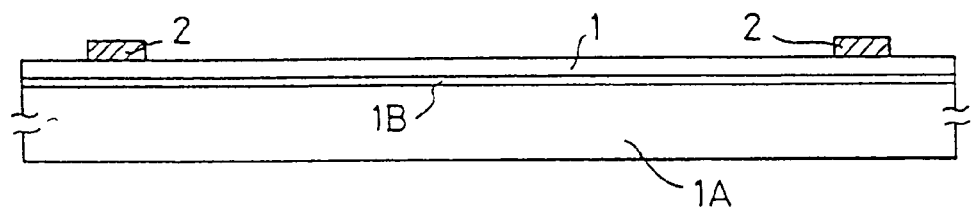
FIG. 2(B)
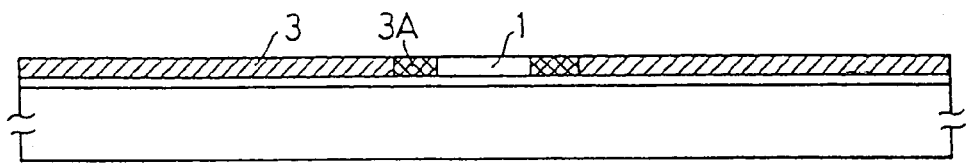
FIG. 2(C)
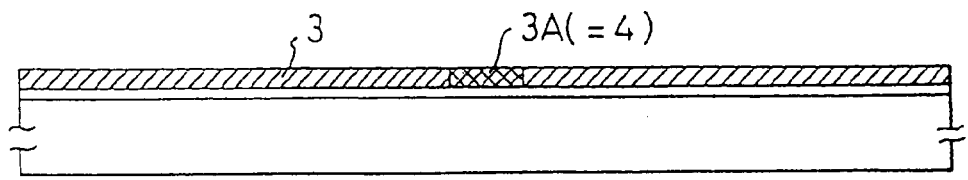
FIG. 2(D)
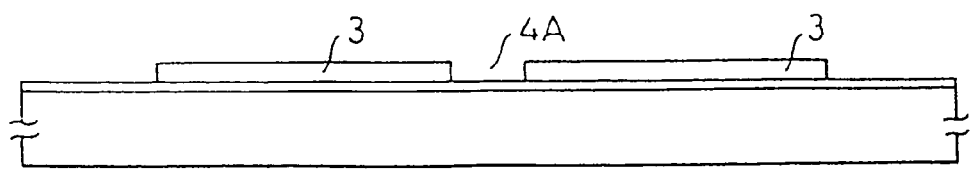

METHOD FOR MANUFACTURING A THIN FILM TRANSISTOR DEVICE

BACKGROUND OF THE INVENTION

1. Field of the Invention

The present invention relates to a method for fabricating an integrated circuit or more concretely to a semiconductor circuit having a matrix device (including an electro-optic display and semiconductor memory) having a matrix structure and a MOS or MIS (metal-insulator-semiconductor) type field effect element (hereinafter generally referred to as a MOS type element) as a switching element and characterized in its dynamic operation such as a liquid crystal display device and dynamic RAM (DRAM) and a driving circuit therefor or an integrated driving circuit like an image sensor. The present invention particularly relates to a device employing a thin film semiconductor element such as a thin film semiconductor transistor or the like which is formed on an insulating surface as a MOS type element and to a device having a thin film transistor whose active layer is formed by crystal silicon.

2. Description of the Related Art

Conventionally, a crystalline silicon semiconductor thin film used for a thin film device such as a thin film insulated gate type field effect transistor (TFT) has been fabricated by crystallizing an amorphous silicon film formed by a plasma CVD or thermal CVD method within such an apparatus as an electric furnace for many hours of more than 24 hours at a temperature more than 600° C. The many hours of heat treatment has been required in order to obtain sufficient characteristics such as a high field mobility and high reliability.

However, such conventional method has many problems. One of the problems is that its throughput is low and accordingly, a product cost becomes high. For example, if it takes 24 hours for the crystallization process and if it takes two minutes of processing time per sheet of substrate, 720 substrates must be processed in the same time. However, a tube furnace normally used can process 50 sheets of substrates at most in one time, and when only one apparatus (reaction tube) is used, it takes 30 minutes per sheet. That is, in order to process one sheet in 2 minutes, 15 reaction tubes must be used. It means that a scale of investment must be increased and that because the investment is greatly depreciated, it cannot but be reflected in the product cost.

Another problem lies in the temperature of the heat treatment. Normally, substrates used for fabricating a TFT are roughly divided into those composed of pure silicon oxide such as silica glass and non-alkaline boro-silicated glass such as Corning No. 7059 (hereinafter referred to as Corning 7059). Among them, the former has no problem in terms of temperature because it has an excellent heat resistance and can be handled in the same manner with the wafer process of normal semiconductor integrated circuits. However its cost is high and increases exponentially as the substrate area increases. Accordingly, it is used only for TFT integrated circuits having a relatively small area.

On the other hand, non-alkaline glass has a problem in terms of heat resistance, though its cost is sufficiently low as compare to that of silica glass. Because its strain point is generally around 550 to 650 ° C., or less than 600° C. in case of a readily available material, such problems as irreversible shrinkage and warp are caused on the substrate in a heat treatment at 600° C. and it is remarkable in such a substrate whose diagonal distance exceeds 10 cm. From above reasons, it has been considered to be indispensable to keep the heat treatment conditions under 550° C. and within 4 hours to reduce the cost in crystallizing silicon semiconductor films. It is then an object of the present invention to provide a semiconductor fabricating method that clears such conditions and a semiconductor device-fabricating method using such a semiconductor.

Lately, a study on an insulated gate type semiconductor device having a thin film active layer (or called as an active region) has been conducted. Especially, a thin film insulated gate transistor or so-called a thin film transistor (TFT) has been fervently studied. They are formed on a transparent insulating substrate to use to control each picture element and to drive its matrix in a display device such as a liquid crystal display having a matrix structure or to use as a driving circuit of an image sensor formed similarly or an insulating substrate. They are categorized as an amorphous silicon TFT or crystalline silicon (or called as polycrystalline silicon) TFT depending on a material and crystal state of a semiconductor used.

Lately, a study to use a material which presents an intermediate state between crystalline silicon and amorphous is also being conducted. Although the intermediate state is being discussed, all those which reached to some crystal state by any thermal process (such as by annealing at a temperature more than 450° C. by irradiating strong energy such as laser light) shall be called as crystalline silicon in this specification.

A crystalline silicon TFT is used also in a monocrystal silicon integrated circuit as a so-called SOI technology and it is used as a load transistor for example in a highly integrated SRAM. In this case, however, an amorphous silicon TFT is rarely used.

Further, a very high speed operation is possible in a semiconductor circuit on an insulating substrate because there is no capacitive coupling between the substrate and wires, so that a technology to use it as a very high speed microprocessor or very high speed memory is being proposed.

Generally, a field mobility of a semiconductor in an amorphous state is small and accordingly, it cannot be used for a TFT requiring a high speed operation. Furthermore, because a field mobility of P-type is remarkably small in an amorphous silicon, a P-channel type TFT (a TFT of PMOS) cannot be fabricated and accordingly, a complementary MOS circuit (CMOS) cannot be formed by combining with a N-channel type TFT (a TFT of NMOS).

However, a TFT formed by an amorphous semiconductor has an advantage that OFF current is small. Then it is utilized in the use in which a very high speed operation is not required, only one conductive type will do and a TFT having a high charge retaining ability is required such as transistors of an active matrix of a liquid crystal display having a small matrix scale. However, it has been difficult to use the amorphous silicon TFT for an advanced application such as a liquid crystal display having a large scale matrix; Further, it could not be used naturally for peripheral circuits of a display and for a driving circuit of an image sensor which require a high speed operation.

On the other hand, a crystalline semiconductor has a field mobility larger than that of the amorphous semiconductor and accordingly, a high speed operation is possible. For example, such a large value as 300 $cm^2/Vs$ has been obtained as a field mobility in a TFT using a silicon film re-crystallized by laser annealing. It is an extremely large value considering that a field mobility of a MOS transistor formed on a normal monocrystal silicon substrate is around 500 $cm^2/Vs$. Whereas an operation speed of the MOS circuit on the monocrystal silicon is limited by a parasitic capacity between the substrate and wires, there is no such limit in terms of the TFT using crystallized silicon film because it is formed on the insulating substrate. Accordingly, a remarkable high speed operation is being expected to be achieved in such TFT.

Further, it is possible to form a CMOS circuit by the crystalline silicon because not only a NMOS TFT but also a PMOS TFT can be similarly obtained. For example, among liquid crystal displays in an active matrix system, one having a so-called monolithic structure in which not only the active matrix section but also peripheral circuits (such as a driver) are constructed by a CMOS crystalline silicon TFT is known. The TFT used in the aforementioned SRAM is what this point is noticed, wherein the PMOS is constructed by the TFT as a load transistor.

Furthermore, whereas it is difficult to form a source/drain region by such a self-aligning process as those used in monocrystal IC technology in a normal amorphous TFT and a parasitic capacity caused by the geometrical overlap of a gate electrode and the source/drain region causes a problem, the crystalline silicon TFT has such an advantage that a parasitic capacity can be remarkably suppressed because the self-aligning process can be adopted.

However, a leak current of the crystalline silicon TFT when no voltage is applied to the gate (non-selection time) is great as compare to that of the amorphous silicon TFT, and such countermeasures have been taken that an auxiliary capacity is provided to compensate the leak current and that two TFTs are connected in series to reduce the leak current when it is used in a liquid crystal display.

For example, a method to form an amorphous silicon and to irradiate laser selectively on it to crystallize only a peripheral circuit has been proposed for forming the peripheral circuit of polysilicon TFTs having a high mobility monolithically on the same substrate while utilizing a high OFF resistance of the amorphous silicon TFT.

Presently, however, its yield is low due to a problem of reliability of the laser irradiating process (such as a bad homogeneity of the irradiated energy within the irradiated surface), so that a method to construct a matrix by a morphous silicon TFTs and to construct driving circuits by connecting monocrystal integrated circuits by a TAB method or the like is being adopted in the end. However, this method requires a more than 0.1 mm of pixel pitch from the physical restriction in the connection and its cost becomes high.

The present invention is intended to solve such difficult problems, but it is not desirable to complicate the process and to lower its yield or to increase its cost for that end. What the present invention intends is to fabricate two kinds of TFTs, i.e. a TFT in which a high mobility is required and a TFT in which a leak current is required to be low, readily and discriminately while keeping mass-producibility and while minimizing changes of its process.

Further, it is another object of the present invention to reduce a difference between the mobility of the NMOS and of the PMOS in the CMOS circuit. The reduced difference between the NMOS and PMOS allows to increase a degree of freedom in designing the circuit.

Semiconductor circuits to which the present invention is applied are not universal. That is, the present invention is suited for an active matrix circuit for displaying images by utilizing such materials which change transmittivity or reflectivity of light by an effect of electric field, by sandwiching those materials between electrodes facing to each other and by applying the electric field between those electrodes such as a liquid crystal display; a memory device for holding memory by storing charge in capacitors such as DRAM; a circuit having a dynamic circuit such as a dynamic shift register which drives the next circuit by capacitors of MOS structure portion of MOS transistors or other capacitors; and a circuit having a digital circuit and a circuit for controlling analog signal outputs such as a driving circuit of an image sensor. The present invention is suited especially to a circuit in which dynamic circuits and static circuits are mixedly mounted.

SUMMARY OF THE INVENTION

The present invention is characterized in that a crystalline silicon film is obtained by forming island film, dots, particles, clusters or lines containing a material selected from the group consisting of nickel, iron, cobalt, ruthenium, rhodium, paradium, osmium, iridium, platinum, scandium, titanium, vanadim, chrome, manganese, copper, zinc, gold and silver and a combination thereof on or under the silicon film which is in an amorphous state or in a random crystal state (e.g. a state in which portions having a good crystallinity and amorphous portions are mixed) which can be said substantially as being in an amorphous state, and by annealing it at a temperature lower than a crystallization temperature in a mere heat treatment of normal amorphous silicon for a shorter time; This annealing may be carried out in a hydrogen, oxygen or nitrogen atmosphere. This annealing can be carried out by (1) heating for A hours in an atmosphere containing oxygen and then heating for B hours in an atmosphere containing hydrogen: (2) heating for C hours in an atmosphere containing oxygen and then heating for D hours in an atmosphere containing nitrogen: (3) heating for E hours in an atmosphere containing hydrogen and then heating for F hours in an atmosphere containing oxygen: (4) heating for G hours in an atmosphere containing hydrogen and then heating for H hours in an atmosphere containing nitrogen: (5) heating for I hours in an atmosphere containing nitrogen and then heating for J hours in an atmosphere containing oxygen: (6) heating for K hours in an atmosphere containing nitrogen and then heating for L hours in an atmosphere containing hydrogen: (7) heating far M hours in an atmosphere containing oxygen, heating for N hours in an atmosphere containing hydrogen and then heating for P hours in an atmosphere containing nitrogen: (8) heating for Q hours in an atmosphere containing oxygen, heating for R hours in an atmosphere containing nitrogen and then heating for S hours in an atmosphere containing hydrogen: (9) heating for T hours in an atmosphere containing hydrogen, heating for U hours in an atmosphere containing oxygen and then heating for V hours in an atmosphere containing nitrogen: (10) heating for W hours in an atmosphere containing hydrogen, heating for X hours in an atmosphere containing nitrogen and then heating for Y hours in an atmosphere containing oxygen: (11) heating for Z hours in an atmosphere containing nitrogen, heating for A' hours in an atmosphere containing oxygen and then heating for B' hours in an atmosphere containing hydrogen: or (12) heating for C' hours in an atmosphere containing nitrogen, heating for D' hours in an atmosphere containing hydrogen and then heating for E' hours in an atmosphere containing oxygen.

Concerning to the crystallization of silicon film, a method to form a crystalline island film as a nucleus or seed crystal and to grow it epitaxially in solid phase (for example Japanese Patent Laid-Open No. 1-214110) has been proposed in the past. However, crystal barely grew under 600° C. of temperature by such method. Generally silicon undergoes a process when it transfers from an amorphous state to a crystal state that molecular chains in the amorphous state are parted and after putting the parted molecules into a state that they would not couple with other molecules again, molecules are recombined into a portion of a crystal in combination with some crystalline molecules. However, energy for parting the initial molecular chains and for keeping them in the state not to couple with other molecules is great in this process and it has been blocking the crystallization reaction. In order to supply this energy, it takes several minutes with about 1000° C. of temperature or several tens of hours with about 600° C. of temperature. Because the time exponentially depends on the temperature (=energy), an advancement of the crystallization reaction could not be observed almost at all at less than 600° C. or at 550° C. for example. The concept of epitaxial crystallization in solid phase also could not give any solution to this problem.

Then the inventor of the present invention thought of lowering the blocking energy in the aforementioned process by some catalytic action which is totally different from the concept of conventional solid phase crystallization. The inventor noticed on that nickel (Ni), iron (Fe), cobalt (Co), ruthenium (Ru), rhodium (Rh), paradium (Pd), osmium (Os), iridium (Ir), platinum (Pt), scandium (Sc), titanium (Ti), vanadium (V), chrome (Cr), manganese (Mn), copper (Cu), zinc (Zn), gold (Au) and silver (Ag) readily couple with silicon.

For example, the inventor noticed on that in a case of nickel, it readily turns out to be nickel silicide ($NiSi_x$, $0.4 \leq x \leq 2.5$) and a, lattice constant of nickel silicide is close to that of silicon crystal. Then, when energy and other were simulated in a ternary system of crystal silicon-nickel silicide-amorphous silicon, it was found that amorphous silicon readily reacts at the boundary with the nickel silicide and that the following reaction is brought about:

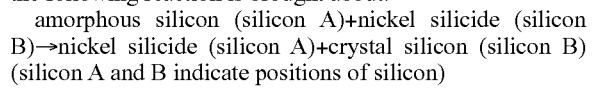
amorphous silicon (silicon A)+nickel silicide (silicon B)→nickel silicide (silicon A)+crystal silicon (silicon B) (silicon A and B indicate positions of silicon)

A potential of the block of this reaction is fully low and a reaction temperature is also low. This reaction formula indicates that the reaction proceeds while converting amorphous silicon into crystal silicon by nickel. It was found that the reaction actually started at less than 580° C. and that the reaction could be observed even at 450° C. Though it is a matter of course, the higher the temperature, the faster the speed of the advancement of reaction was. The same effect was also recognized with other metal elements described above.

According to the present invention, a crystal silicon region is expanded by forming a film, particle or cluster containing at least one of Ni, Fe, Co, Ru, Rh, Pd, Os, Ir, Pt, Sc, Ti, V, Cr, Mn, Cu, Zn, Au and Ag such as island, stripe, line, dot or film of nickel or other simple metal substances described above or their silicide as a starting point and by developing those metal elements from the point to surroundings along the reaction described above. By the way, oxide is not preferable as a material containing those metal elements, because oxide is a stable compound and cannot start the aforementioned reaction.

The crystal silicon expanded from a specific point has a structure close to monocrystal with good continuity of crystallinity, though it differs from the conventional solid phase epitaxial growth, so that it is convenient in using for semiconductor devices such as a TFT. However, an infinite number of crystallization starting points existed when a material containing the aforementioned metals for accelerating the crystallization such as nickel was provided homogeneously on a substrate and due to that, it was difficult to obtain a film having a good crystallinity.

A better result was obtained when a concentration of hydrogen was less in the amorphous silicon film as the starting material of this crystallization. However, because hydrogen was released as the crystallization advanced, no such a clear correlation was seen between a concentration of hydrogen within a silicon film obtained and that in the amorphous silicon film as the starting material. The concentration of hydrogen within the crystal silicon of the present invention was typically more than 0.01 atomic percent and less than 5 atomic percent.

Although Ni, Fe, Co, Ru, Rh, Pd, Os, Ir, Pt, Sc, Ti, V, Cr, Mn, Cu, Zn, Au and Ag are used in the present invention, these materials are not generally preferable for silicon as a semiconductor material and it is necessary to remove them. In terms of nickel, because nickel silicide which reached the end of the crystallization as a result of the aforementioned reaction is easily resolved in hydrofluoric acid or hydrochloric acid or dilution of them, nickel can be reduced from the substrate by means of a treatment by those acids. Further, those metal elements can be positively reduced by treating at 400 to 600° C. in an atmosphere containing chlorine such as hydrogen chloride, various methane chlorides ($CH_3Cl$, $CH_2Cl_2$, $CHCl_3$), various ethane chlorides ($C_2H_5Cl$, $C_2H_4Cl_2$, $C_2H_3Cl_3$, $C_2H_2Cl_4$, $C_2HCl_5$) or various ethylene chlorides ($C_2H_3Cl$, $C_2H_2Cl_2$, $C_2HCl_3$) after the end of the crystallization process. Especially, trichloroethylene ($C_2HCl_3$) is a material which can be easily used. A concentration of Ni, Fe, Co, Ru, Rh, Pd, Os, Ir, Pt, Sc, Ti, V, Cr, Mn, Cu, Zn, Au and Ag in the silicon film of the present invention was typically more than 0.005 atomic percent and less than 1 atomic percent.

In using the crystal silicon film fabricated according to the present invention for a semiconductor element such as a TFT, it is not preferable to provide the semiconductor element on the end of the crystallization (it is also a portion where the crystallization started from a plurality of starting points hit each other) because a large grain boundary (a portion where crystallinity is discontinued) exists and the concentration of metal elements which accelerate the crystallization such as nickel is high there as it is obvious from the description above. Accordingly, a pattern of a coating film containing the metal elements which become the starting point of the crystallization and accelerate it such as nickel and a pattern of the semiconductor element must be optimized in forming the semiconductor element utilizing the present invention.

In the present invention, roughly there are two methods for patterning the metal elements which accelerate the crystallization. A first method is to selectively form a film or the like of those metals before forming an amorphous silicon film and a second method is to selectively form a film or the like of those metals after forming the amorphous silicon film.

The first method can be implemented by using a normal photolithographic means or lift-off means. The second method is complicated more or less. That is, if the film or the like of the metals which accelerate the crystallization is formed adhering to the amorphous silicon film, the metal and the amorphous silicon partially react each other producing silicide when forming the film. Therefore, it is necessary to fully etch such silicide layer when patterning after forming the metal film or the like.

In the second method, the liftoff method is relatively easily carried out. In this case, organic materials such as photoresist or non-organic materials such as silicon oxide or silicon nitride may be used as a masking material. A processing temperature must be taken into consideration in selecting the masking material. Further, because a masking action differs depending on materials, a full attention needs to be paid on it.

Especially, a film of silicon oxide or silicon nitride formed by various CVD methods has many pinholes and the crystallization may advance from an unexpected section if the film is not fully thick.

Generally, patterning is implemented after forming the coating film using those masking materials to selectively expose the surface of amorphous silicon. Then the metal film or the like which accelerates the crystallization is formed.

What must be taken care of in the present invention is the concentration of metal elements within the silicon film. Although nothing is better than that its amount is small, it is also important for the amount to be always kept constant. It is because a considerable fluctuation in the degree of crystallization is brought about per lot in the manufacturing site if the amount of the metal element fluctuates significantly. It becomes more difficult to reduce the fluctuation of the amount especially when the amount of the metal element is required to be less.

In the first method, because the metal film or the like selectively formed is coated by the amorphous silicon film, it cannot be taken out later to adjust its amount. In terms of the amount of metal element required in the present invention, the thickness of the metal film or the like is so thin as several to several tens angstrom, so that it is difficult to form the film with a good reproducibility.

The same also applies to the second method. However, there is a room of improvement in the second method as compare to the first method because the metal film or the like which accelerate the crystallization exists an the surface in this method. That is, a fully thick metal film is formed and a heat treatment (pre-annealing) is implemented at a temperature lower than an annealing temperature before annealing to react a part of the amorphous silicon film and the metal film and to produce silicide. Then the metal film which did not react is etched. Although it depends an a metal used, there is no problem particularly in terms of Ni, Fe, Co, Ti and Cr because there is an etchant in which an etching rate of the metal film and the silicide is fully large.

In this case, a thickness of the silicide layer obtained is determined by the temperature and time of the heat treatment (pre-annealing) and the thickness of the metal layer has almost nothing to do with it. Due to that, the very small amount of metal element introduced in the amorphous silicon film can be controlled.

The present invention also utilizes that there is a difference in degrees of crystallization when the surface of semiconductor is covered by a coating film (cover film) of silicon oxide or silicon nitride and when not covered when crystallizing a crystalline silicon TFT in a temperature at 450 to 1000° C. or preferably at 500 to 800° C. in an atmosphere containing oxygen, hydrogen or nitrogen. Such atmosphere can be an atmosphere containing oxygen, atmosphere containing hydrogen, atmosphere containing nitrogen, atmosphere containing oxygen and hydrogen, atmosphere containing oxygen and nitrogen, atmosphere containing hydrogen and nitrogen or atmosphere containing oxygen, hydrogen and nitrogen. The aforementioned crystallization can be carried out by (1) heating for A hours in the atmosphere containing oxygen and then heating for B hours in the atmosphere containing hydrogen: (2) heating for C hours in the atmosphere containing oxygen and then heating for D hours in the atmosphere containing nitrogen: (3) heating for E hours in the atmosphere containing hydrogen and then heating for F hours in the atmosphere containing oxygen: (4) heating for G hours in the atmosphere containing hydrogen and then heating for H hours in the atmosphere containing nitrogen: (5) heating for I hours in the atmosphere containing nitrogen and then heating for J hours in the atmosphere containing oxygen: (6) heating for K hours in the atmosphere containing nitrogen and then heating for L hours in the atmosphere containing hydrogen: (7) heating for M hours in the atmosphere containing oxygen, heating for N hours in the atmosphere containing hydrogen and then heating for P hours in the atmosphere containing nitrogen: (8) heating for Q hours in the atmosphere containing oxygen, heating for R hours in the atmosphere containing nitrogen and then heating for S hours in the atmosphere containing hydrogen: (9) heating for T hours in the atmosphere containing hydrogen, heating for U hours in the atmosphere containing oxygen and then heating for V hours in the atmosphere containing nitrogen: (10) heating for W hours in the atmosphere containing hydrogen, heating for X hours in the atmosphere containing nitrogen and then heating for Y hours in the atmosphere containing oxygen: (11) heating for Z hours in the atmosphere containing nitrogen, heating for A' hours in the atmosphere containing oxygen and then heating for B' hours in the atmosphere containing hydrogen: or (12) heating for C' hours in the atmosphere containing nitrogen, heating for D' hours in the atmosphere containing hydrogen and then heating for E' hours in the atmosphere containing oxygen. It is particularly preferable (4) to heat for G hours in the atmosphere containing hydrogen and then to heat for H hours in the atmosphere containing nitrogen, (5) to heat for I hours (4 hours for example) in the atmosphere containing nitrogen and then to heat for J hours (1 hour for example) in the atmosphere containing oxygen, or (6) to heat for K hours (4 hours for example) in the atmosphere containing nitrogen and then to heat for L hours (1 hour for example) in the atmosphere containing hydrogen. Generally the crystallinity is good and as a natural consequence, a TFT having a high mobility can be obtained when the cover film exists. However, generally its leak current becomes significant. On the other hand, the one having no cover film has an advantage that the leak current is low, though the crystallinity is not good and its mobility is low because it turns out be amorphous state depending on temperature.

This characteristic is considered to be governed by the existence of hydrogen, oxygen or nitrogen within the atmosphere infiltrated to the active layer. This crystallization may be carried out by implementing it in nitrogen for example and then in hydrogen or oxygen. Thus TFTs having different characteristics may be formed on the same substrate in the same time and in the same process. For example, the former high mobility TFT can be used as a driving circuit of a matrix and the latter low leak current TFTs can be used as TFTs in the matrix portion.

Or a mobility in the NMOS can be relatively reduced as compare to that in the PMOS and a difference between the both can be almost eliminated in the optimum condition by not providing the cover film on the NMOS region and providing it on the PMOS region in the CMOS circuit.

The temperature of the thermal crystallization is an important parameter and the crystallinity of a TFT is determined by the temperature in the present invention. Generally, the temperature of thermal annealing is restricted by a substrate and other materials. As far as the restriction of a substrate material is concerned, a thermal annealing of up to 1100° C. is possible when silicon and silica are used as a substrate. However, it is desirable to anneal at less than 650° C. of temperature in a case of Corning 7059 glass which is a typical non-alkaline glass. However, it must be set considering characteristics required for each TFT, other than the substrate, in the present invention from the aforementioned reasons. When the annealing temperature is high, generally a growth of crystal of TFT advances, the mobility is increased and the leak current increases. Accordingly, the annealing temperature should be 450 to 1000° C. or preferably 500 to 800° C. in order to obtain TFTs having different characteristics on the same substrate like the present invention.

One such example of the present invention is that in a display section of an active matrix circuit of a liquid crystal display or the like, polysilicon TFTs are used as switching transistors and that no cover film is provided in the active matrix region when crystallizing an active layer and on the other hand the cover film is provided on the peripheral circuit region to turn the former into low leak current TFTs and the latter into high mobility TFTs.

FIG. 8(A) shows a conceptual drawing of a device having a display circuit section (active matrix) and a driving circuit (peripheral circuit) therefor as described above. In the figure, a display device is shown in which a data driver 101 and gate driver 102 are arranged, an active matrix 103 having TFTs is arranged in the middle and those driver sections and the active matrix are connected through gate lines 105 and data lines 106 on an insulating substrate 107. The active matrix 103 is an aggregate of picture element cells 104 having a NMOS or PMOS TFT (PMOS in the figure).

For a CMOS circuit of the driver section, a concentration of impurities such as oxygen, nitrogen and carbon in the active layer is desirable to be less than $10^{18}$ cm$^{-3}$ or preferably less than $10^{17}$ cm$^{-3}$ in order to obtain a high mobility. As a result, a threshold voltage of the TFT was 0.5 to 2 V in the NMOS and −0.5 to −3 V in the PMOS for example and a mobility was 30 to 150 cm$^2$/Vs in the NMOS and 20 to 100 cm$^2$/Vs in the PMOS.

On the other hand, an auxiliary capacity could be reduced and further be totally eliminated in the active matrix section by using single or a plurality of elements in series having as low as about 1 pA of leak current with 1 V of drain voltage.

A second example of the present invention relates to a semiconductor memory. A semiconductor memory device by means of monocrystal ICs has already reached to its limit in terms of speed. Although it is necessary to increase a current capacity of transistors in order to operate it in a higher speed, it causes a further increase of power consumption and it cannot but be dealt by increasing driving voltage so long as a capacity of capacitors cannot be increased further for a DRAM which carries out memory operations by storing charge in the capacitors.

One reason why it is said that monocrystal ICs have reached its speed limit is because a large loss is brought about by a capacity of the substrate and wires. It is possible to drive in fully high speed without increasing power consumption if an insulator is used for the substrate. From such a reason, an IC having a SOI (semiconductor on insulator) structure has been proposed.

A circuit arrangement of the DRAM is almost the same with that of the aforementioned liquid crystal display device in a case of 1 Tr/cell structure and in a DRAM having a structure other than that (for example 3 Tr/cell structure), no cover film is provided in a memory bit section when crystallizing an active layer and on the other hand, a cover film is provided on a region of a driving circuit because it is required to operate in fully high speed in the same manner with the case of the aforementioned liquid crystal display device to turn the former into low leak current TFTs and the later into high leak current TFTs.

The basic block structure of such semiconductor memory device is the same with that shown in FIG. 8A. For example, in the DRAM, the reference numeral (101) can be a column decoder, (102) a row decoder, (103) a memory elements section, (104) a unit memory bit, (105) bit lines, (106) word lines, and (107) an (insulating) substrate.

A third application example of the present invention is a driving circuit for an image sensor or the like. FIG. 8(B) shows an example of a one bit circuit of an image sensor, wherein a flip-flop circuit 108 and a buffer circuit 109 are normally constructed by a CMOS circuit and are required to respond in such high speed that they can follow up high speed pulses applied to a scan line. On the other hand, a TFT 110 in a signal output stage plays a role of a dam that discharges a charge accumulated in a capacitor by a photodiode to a data line by receiving a signal from the shift register sections 108 and 109.

Such TFT 110 is required not only to respond in high speed but also to have less leak current. Accordingly, the region of the circuits 108 and 109 is crystallized by providing a cover film to turn it into a high mobility TFT and the region of the TFT 110 on the other hand is crystallized without providing cover film to turn it into a low leak current TFT in such a circuit.

In the present invention, silicon oxide, silicon nitride or silicon oxinitride ($SiN_xO_y$) may be used as the cover film. Although the thicker the cover film, the better the covering ability is, the thickness must be determined considering a mass-producibility and covering ability thereof because it takes a time to form a thick film. Though the covering ability differs depending on a quality of film, typically the thickness must be more than 20 nm for a silicon oxide film and more than 10 nm for a silicon nitride film. The thickness is desired to be 20 to 200 nm for both of the silicon oxide film and the silicon nitride film when considering mass-producibility and reliability.

The above and other advantages of the present invention will become more apparent in the following description and the accompanying drawings in which like reference numerals refer to like parts throughout several views.

BRIEF DESCRIPTION OF THE DRAWINGS

FIGS. 2(A-1), 2(A-2) and 2(B) to 2(D) are section views showing the process of the embodiment (a selectively crystallizing process)

DETAILED DESCRIPTION OF PREFERRED EMBODIMENTS

First Embodiment

Figure 1A:
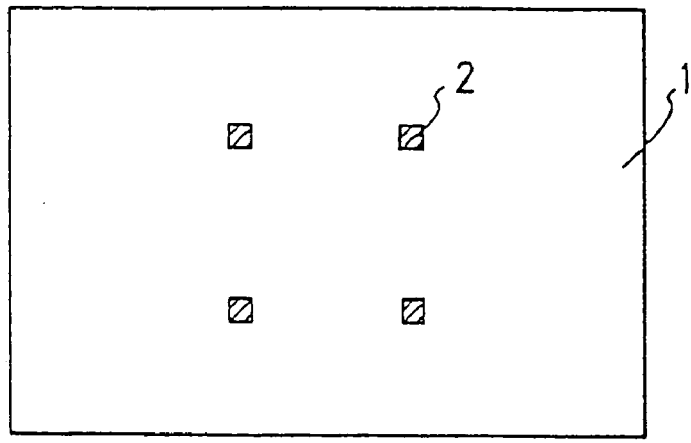
FIGS. 1(A) to 1(C) are top views showing a process of the present embodiment (crystallization and arrangement of TFT)

A method for fabricating a TFT using a crystal silicon film obtained by crystallizing an amorphous silicon film using a plurality of island nickel films formed on Corning 7059 glass substrate as starting points will be described in the present embodiment. There are two methods for forming the island nickel films depending on whether it is formed on or under the amorphous silicon film. FIG. 2(A-1) shows the method wherein it is formed under the film and FIG. 2(A-2) shows the method wherein it is formed on the film. What must be careful especially about the later is that because nickel is selectively etched after forming it on the whole surface of the amorphous silicon film in the process, nickel and amorphous silicon react each other and produce nickel silicide, though it is a small amount. Because a good crystalline silicon film which the present invention aims for cannot be obtained if this nickel silicide remains as it is, it is necessary to remove this nickel silicide fully by hydrochloric acid or hydrofluoric acid. Due to that, the amorphous silicon is thinned down from the initial state.

On the other hand, although no such problem is caused in the case of the former, it is desirable to completely remove the nickel film other than that of the island portion 2 by etching also in this case. The influence of the residual nickel may be suppressed by oxidizing nickel other than that of the island region by treating the substrate by oxygen plasma or ozone.

In either of the cases, a ground silicon oxide film 1B with a thickness of 2000 angstrom was formed on a substrate 1A (Corning 7059) by a plasma CVD method. The amorphous silicon film 1 was fabricated by a plasma CVD method or vacuum CVD method with a thickness of 200 to 3000 angstrom or preferably 500 to 1500 angstrom. The amorphous silicon film was readily crystallized after removing hydrogen by annealing 0.1 to 2 hours at 350 to 450° C. to keep the hydrogen concentration within the film to less than 5 atomic percent.

In the case of FIG. 2(A-1), the nickel film was accumulated up to a thickness of 50 to 1000 angstrom or preferably to 100 to 500 angstrom by sputtering and was patterned to form the island nickel regions 2 before forming the amorphous silicon film 1.

In the case of FIG. 2(A-2) on the other hand, the nickel film was accumulated up to 50 to 1000 angstrom or preferably to 100 to 500 angstrom by sputtering and was patterned to form the island nickel regions 2 after forming the amorphous silicon film 1. FIG. 1(A) shows this state seen from above.

Each of the island nickel is a square with a side of 2 micron and an interval therebetween was set at 5 to 50 micron or 20 micron for example. A similar effect may be obtained by using nickel silicide instead of nickel. A good result could be obtained when the substrate was heated up to 100 to 500° C. or preferably to 180 to 250° C. when the nickel was to be formed. It is because an adhesion of the ground silicon oxide film with the nickel film is improved and because nickel silicide is produced by the reaction of silicon oxide and nickel. The same effect can be obtained by using silicon nitride, silicon carbide or silicon instead of silicon oxide.

It was then annealed in a nitrogen atmosphere for 8 hours at 450 to 580° C. or at 550° C. for example. This annealing may be carried out in a mixed atmosphere of nitrogen and hydrogen. Or this annealing may be carried out in a hydrogen atmosphere for $X_1$ hours and then in a nitrogen atmosphere for $X_2$ hours. FIG. 2(B) shows the intermediate state of this process wherein nickel advance from the island nickel regions 2 near the edge to the center as nickel silicide 3A and portions 3 where nickel had passed have become crystal silicon. Then as shown in FIG. 2(C), the crystallizations which started from the two island nickel films hit and the nickel silicide 3A remains in the middle, thereby ending the crystallization.

Figure 1B:
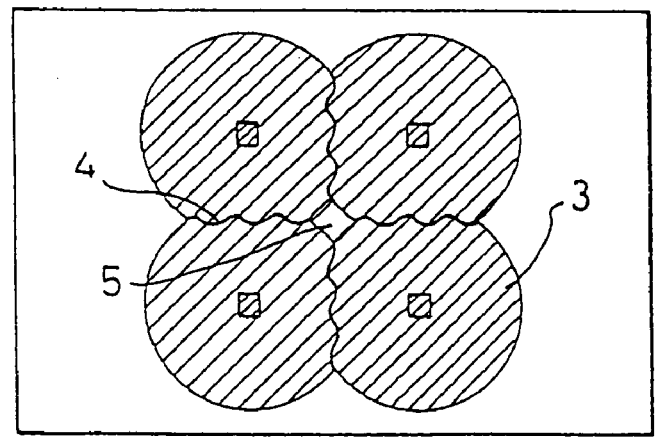

FIG. 1(B) shows the substrate in this state seen from above, wherein the nickel silicide 3A in FIG. 2(C) is an intercrystalline boundary 4. When the annealing is continued, nickel moves along the intercrystalline boundary 4 and gathers an intermediate region 5 of those island nickel regions (though their original shape is not kept in this state).

Figure 1C:
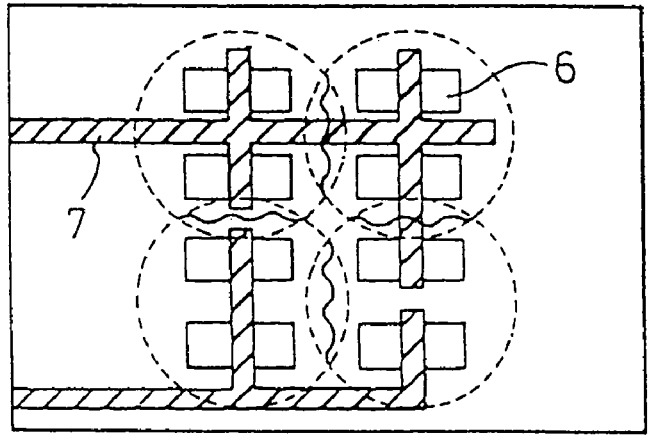

Crystal silicon can be obtained by the aforementioned process, but it is not desirable for nickel to diffuse within the semiconductor coating film from the nickel silicide 3A produced at this time. Accordingly, it is desirable to eliminate the region where nickel is highly concentrated by etching by hydrofluoric acid or hydrochloric acid. By the way, because an etching rate of the nickel and nickel silicide is fully large, the silicon film is not affected in the etching by means of hydrofluoric acid or hydrochloric acid. The regions where the growing point of nickel had been located were removed together in the same time. FIG. 2(D) shows the state after the etching. The portion where there was the intercrystalline boundary turns out to be a groove 4A. It is not desirable to form semiconductor regions (active layer or the like) of a TFT so as to pinch this groove. The TFT was arranged so that semiconductor regions 6 would not cross the intercrystalline boundary 4 as shown in FIG. 1(C). That is, the TFT was formed in a crystal growth region in the horizontal direction parallel to the substrate, not in the thickness direction of the coating film, by the action of nickel. Then, the growth direction of the crystal could be uniformly arranged and residual nickel could be minimized. As a result, a high TFT characteristics could be obtained. On the other hand, gate wires 7 may cross the intercrystalline boundaries 4.

Figure 3A:
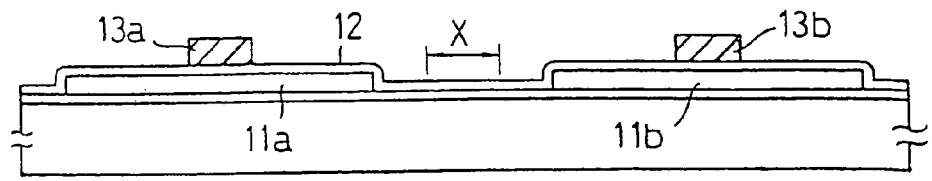
FIGS. 3(A) to 3(C) are section views showing the process of the embodiment (see a first embodiment)
Figure 3B:
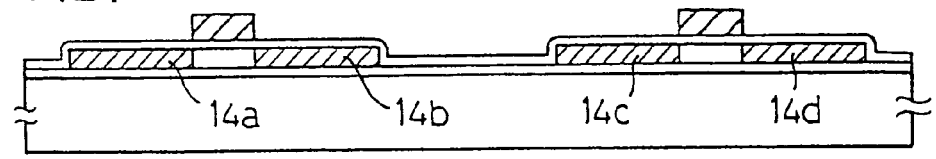

FIGS. 3 and 4 show examples of the method for fabricating a TFT using the crystal silicon obtained in the process described above. In FIG. 3(A), the reference character X in the middle indicates the place where there was the groove 4A in FIG. 2. As shown in the figure, it was arranged so that semiconductor regions of the TFT would not cross this X portion. That is, island semiconductor regions 11a and 11b were formed by patterning the crystal silicon film 3 obtained in the process shown in FIG. 2. Then a silicon oxide film 12 which functions as a gate insulating film was formed by such methods as RF plasma CVD, ECR plasma CVD or sputtering.

Further gate electrodes 13a and 13b were formed by forming a polycrystalline silicon film with a thickness of 3000 to 6000 angstrom in which $1 \times 10^{20}$ to $5 \times 10^{20}$ cm$^{-3}$ of phosphorus is doped by a vacuum CVD method and then by patterning it (FIG. 3(A)).

Then impurity was doped by a plasma doping method. As a doping gas, phosphine ($Ph_3$) was used for an N type TFT and diborane ($B_2H_6$) for a P type TFT. The figure shows the N type TFT. An acceleration voltage was 80 keV for phosphine and 65 keV for diborane. The impurity was activated by annealing for four hours at 550° C. to form impurity regions 14a through 14d. A method of using optical energy such as laser annealing or flash lamp annealing may be also used for the activation (FIG. 3(B)).

Figure 3C:
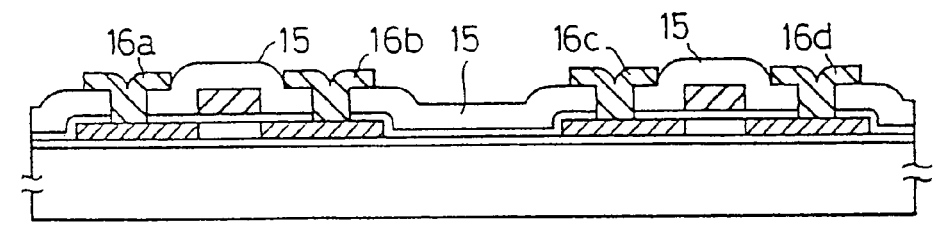

Finally, a silicon oxide film with a thickness of 5000 angstrom was deposited as an interlayer insulator 15 similarly to a case when TFT is normally fabricated, and contact holes were formed therethrough to form wires and electrodes 16a through 16d in source and drain regions (FIG. 3(C)).

The TFT (N channel type in the figure) was thus fabricated in the process described above. The field effect mobility of the TFT obtained was 40 to 60 cm$^2$/Vs in the N channel type and 30 to 50 cm$^2$/Vs in the P channel type.

Figure 4A:
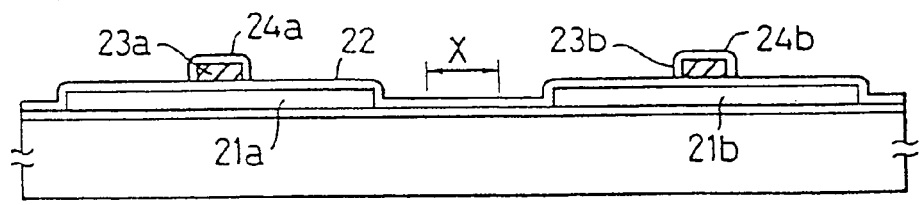
FIGS. 4(A) to 4(C) are section views showing the process of the embodiment (see the first embodiment)
Figure 4B:
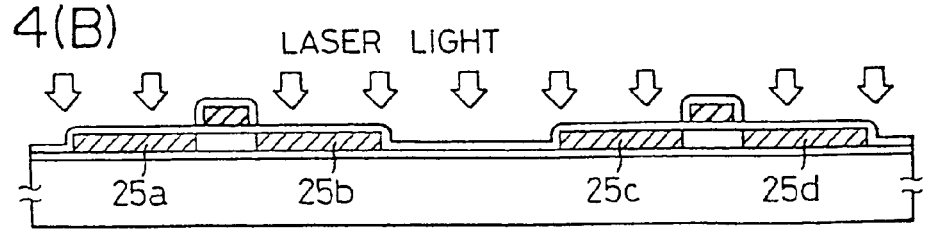

FIG. 4 shows a process how a TFT for aluminum gate was fabricated. In FIG. 4(A), the reference character X in the middle indicates the place where there was the groove 4A in FIG. 2. As shown in the figure, it was arranged so that semiconductor regions of the TFT would not cross this X portion. That is, island semiconductor regions 21a and 21b were formed by patterning the crystal silicon film 3 obtained in the process shown in FIG. 2. Then a silicon oxide film 22 which functions as a gate insulating film was formed by such methods as RF plasma CVD, ECR plasma CVD or sputtering. When the plasma CVD method was adopted, a preferable result could be obtained by using TEOS (tetra-ethoxi-silane) and oxygen as original gases. Then an aluminum film (5000 angstrom thick) containing 1% of silicon was deposited by sputtering and was patterned to form gate wires and electrodes 23a and 23b.

Next, the substrate was soaked into an ethylene glycol solution of 3% tartaric acid and anodic oxidation was implemented by setting platinum as a cathode and an aluminum wire as an anode and by flowing current therebetween. The current was applied so that its voltage would increase 2 V/min. initially and the voltage was fixed when it reached to 220 V. The current was stopped when it became less than 10 microA/m$^2$. As a result, anode oxides 24a and 24b with a thickness of 2000 angstrom were formed as shown in FIG. 4(A).

Then impurity was doped by a plasma doping method. As a doping gas, phosphine ($PH_3$) was used for an N type TFT and diborane ($B_2H_6$) for a P type TFT. The figure shows the N type TFT. An acceleration voltage was 80 keV for phosphine and 65 keV for diborane. The impurity was activated by annealing by laser to form impurity regions 25a through 25d. The laser used was a KrF laser (wavelength: 248 nanometer) and five shots of laser lights having 250 to 300 mJ/cm$^2$ of energy density were irradiated (FIG. 4(B)).

Figure 4C:
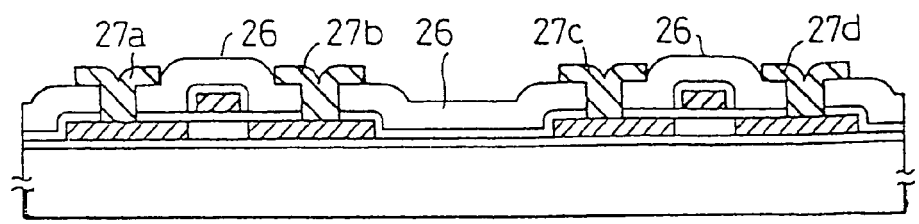

Finally, a silicon oxide film with a thickness of 5000 angstrom was deposited as an interlayer insulator 26 similarly to the case when TFT is normally fabricated and contact holes were formed therethrough to form wires and electrodes 27a through 27d in source and drain regions (FIG. 4(C)).

The field effect mobility of the TFT obtained was 60 to 120 cm$^2$/Vs in the N channel type and 50 to 90 cm$^2$/Vs in the P channel type TFT. In a shift register fabricated by using this TFT, operations at 6 MHz in 17 volts of drain voltage and at 11 MHz in 20 V were confirmed.

Second Embodiment

Figure 5A:
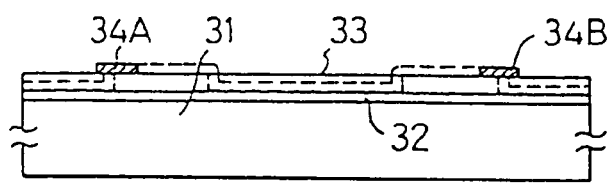
FIGS. 5(A) to 5(C) are section views showing the process of the embodiment (see a second embodiment)

FIG. 5 shows a case when a TFT for an aluminum gate was fabricated similarly to that shown in FIG. 4. However, the amorphous silicon was used as an active layer in this embodiment: As shown in FIG. 5(A), a ground silicon oxide film 32 was deposited on a substrate 31 and an amorphous silicon film 33 with a thickness of 2000 to 3000 angstrom was deposited further on that. An adequate amount of P type or N type impurities may be mixed in the amorphous silicon film. Then island nickel or nickel silicide coating film 34A and 34B were formed as described above and the amorphous silicon film was crystallized by growing laterally by annealing for 8 hours at 550° C. or for four hours at 600° C. in this state.

Figure 5B:
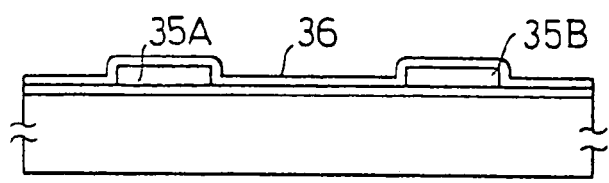

Then a crystal silicon film thus obtained was patterned as shown in FIG. 5(B). At this time, because the silicon film contained a large amount of nickel in the middle in the figure (the intermediate portion between the nickel or nickel silicide film 34A and 34B), the patterning was carried out so as to remove such portion and to form island silicon regions 35A and 35B.

Then a substantially intrinsic amorphous silicon film 36 was deposited further on that.

Figure 5C:
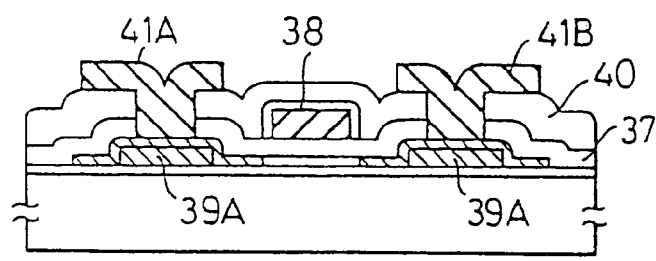

After that, as shown in FIG. 5(C), a coating film was formed by such substances as silicon nitride and silicon oxide as a gate insulating film 37. A gate electrode 38 was formed by aluminum and an anodic oxidation was implemented in the same manner with the case of FIG. 4. Then impurity was diffused by an ion doping method to form impurity regions 39A and 39B. Then the TFT was completed by depositing further an interlayer insulator 40, by forming contact holes and forming metallic electrodes 41A and 41B at source and drain regions. This TFT is characterized in that the semiconductor film at the source and drain portions is thick and that a resistance thereof is small. As a result, a resistance in the source and drain regions is reduced and the characteristics of the TFT is improved. Further, contact holes can be readily formed.

Third Embodiment

Figure 6A:
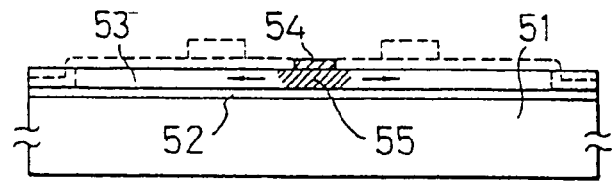
FIGS. 6(A) to 6(C) are section views showing the process of the embodiment (see a third embodiment)
Figure 6B:
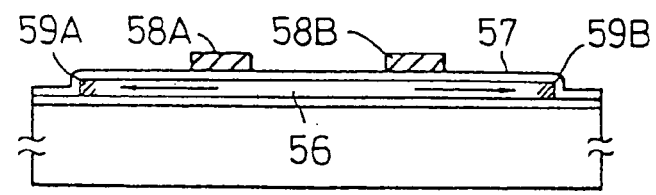

FIG. 6 shows a process when a CMOS type TFT was fabricated. As shown in FIG. 6(A), a ground silicon oxide film 52 was deposited on a substrate 51 and an amorphous silicon film 53 with a thickness of 1000 to 1500 angstrom was deposited further on that. Then as described above, island nickel or nickel silicide coating film 54 was formed and annealing was implemented in this state at 550° C. A silicon silicide region 55 moved in the direction of plane, not in the direction of thickness, of the coating film and the crystallization advances by this process. The amorphous silicon film changed into crystal silicon as shown in FIG. 6(B) by four hours of annealing. The silicon silicide regions 59A and 59B were driven away toward the edge along the advancement of the crystallization.

Then an island silicon region 56 was formed by patterning the crystal silicon film thus obtained as shown in FIG. 6(B) Here, an attention must be paid on that nickel was highly concentrated in the both ends of the island region. After forming the island silicon region, a gate insulating film 57 and gate electrodes 58A and 58B were formed.

Figure 6C:
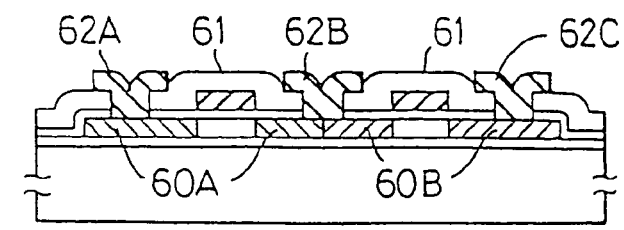

Then N type impurity regions 60A and P type impurity regions 60B were formed by diffusing an impurity by an ion doping method as shown in FIG. 6(C). At this time, the doping can be carried out by using phosphorus as a N type impurity (doping gas is phosphine $PH_3$) and by doping across the whole surface by 60 to 110 kV of acceleration voltage and then after covering the region of the N channel type TFT by a photoresist, by using boron for example as a P type impurity (doping gas is diborane $B_2H_6$) and by doping with 40 to 80 kV of acceleration voltage.

After the doping, the source and drain region were activated by irradiating laser light similarly to the case in FIG. 4. Then the TFT was completed by depositing further an interlayer insulator 61, by forming contact holes and forming metallic electrodes 62A, 62B and 62C at the source and drain regions.

Fourth Embodiment

FIG. 7 shows the fourth embodiment. The present embodiment relates to a method in which silicide is produced by reacting a nickel film with a portion of amorphous silicon film by a first heat treatment (pre-annealing) and the amorphous silicon is crystallized by annealing after removing a non-reactive nickel film.

A ground silicon oxide film 702 (thickness: 2000 angstrom) was formed on a substrate (Corning No. 7059) 701 by a sputtering method. Then a silicon film 703 with a thickness of 300 to 800 angstrom or 500 angstrom thick for example was formed. Further, a silicon oxide film 704 was formed by a plasma CVD method. This silicon oxide film 704 acts as a masking material and its thickness was preferred to be 500 to 2000 angstrom. If it is too thin, the crystallization advances from an unexpected location by pinholes and if it is too thick, it takes a time to form the film and is not suited for mass-production. Then it was set at 1000 angstrom here.

After that, the silicon oxide film 704 was patterned by a known photolithographic process. Then a nickel film 705 (thickness: 500 angstrom) was formed by a sputtering method. The thickness of the nickel film 705 was preferred to be more than, 100 angstrom (FIG. 7(A)).

Then it was annealed for 10 to 60 minutes in a nitrogen atmosphere at 250 to 450° C. (a pre-annealing process). For example, it was annealed for 20 minutes at 450° C. As a result, a nickel silicide layer 706 was formed within the amorphous silicon. A thickness do this layer was determined by a temperature and time of the pre-annealing and the thickness of the nickel film 705 was almost nothing to do with it (FIG. 7(B)).

After that, the nickel film was etched. Nitric or hydrochloric solution was suitable for the etching. The nickel silicide layer was barely etched during the etching of the nickel film by those etchants. In the present embodiment, an etchant in which acetic acid was added into nitric acid as a buffer was used. The ratio set was: nitric acid:acetic acid:water=1:10:10. After removing the nickel film, it was annealed for 4 to 8 hours at 560° C. (a crystallizing annealing process).

Figure 7A:
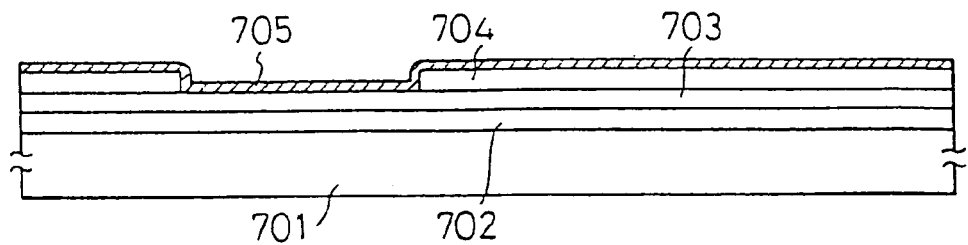
FIGS. 7(A) to 7(E) are section views showing the process of the embodiment (see a fourth embodiment)
Figure 7B:
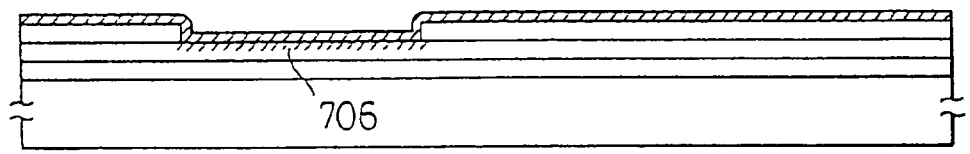
Figure 7C:
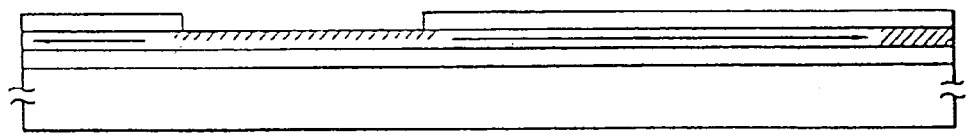
Figure 7D:
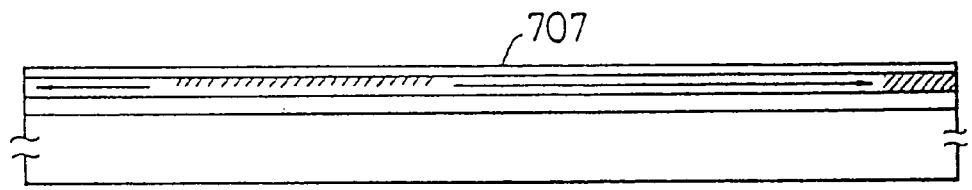
Figure 7E:
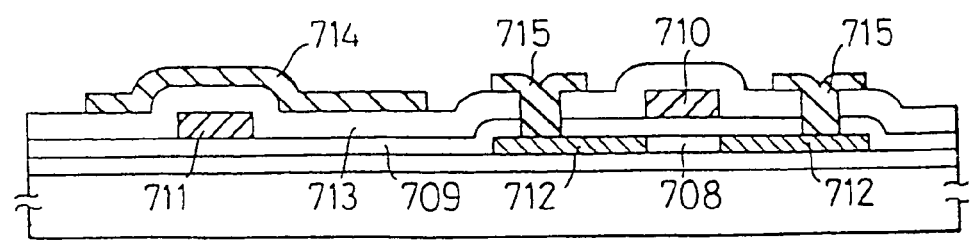
Figure 8A:
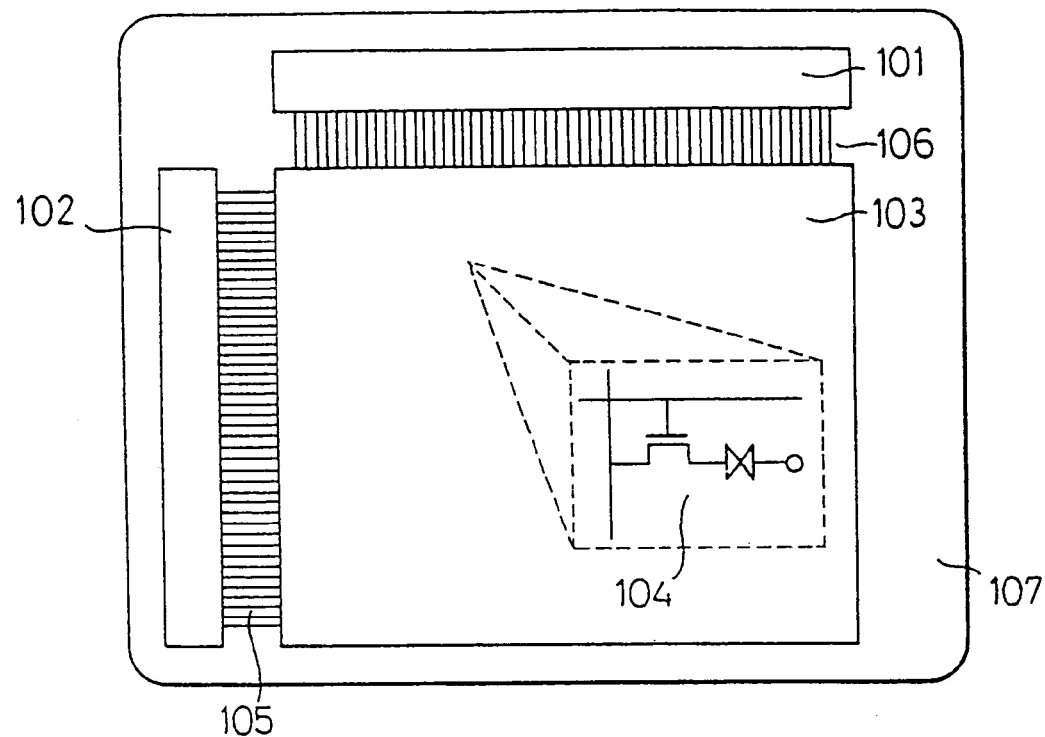
FIG. 8(A) is a block diagram showing a case when the present invention is applied to am active matrix device.
Figure 8B:
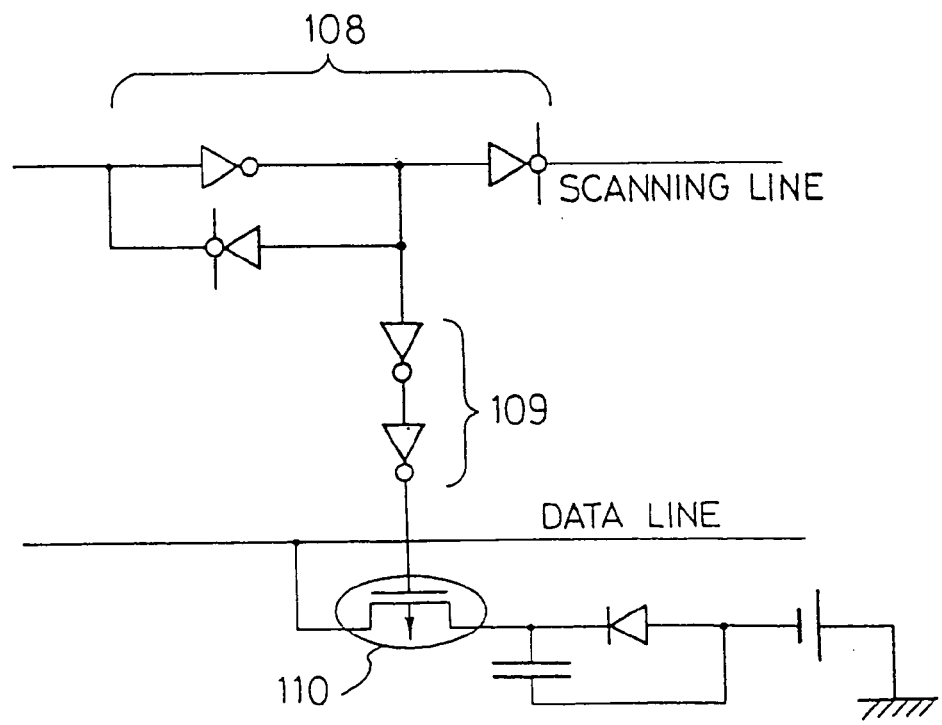
FIG. 8(B) is a circuit diagram of an exemplified circuit when the present invention is applied to a drive circuit of an image sensor.

Several methods were tried in the crystallizing annealing process. A first method was to implement this process while remaining the masking material 704 as shown in FIG. 7(C). The crystallization advances as indicated by arrows in FIG. 7(C). A second method was to anneal after removing all the masking material and exposing the silicon film. A third method was to anneal after removing the masking material and after forming a new coating film 707 composed of silicon oxide or silicon nitride on the surface of silicon film as a protection film as shown in FIG. 7(D).

Although the first method was simple, the surface of the masking material 704 reacted with nickel in the pre-annealing step, and became silicate in the crystallizing annealing process at a higher temperature, and became hard to be etched. That is, because an etching rate of the silicon film and masking material 704 becomes almost equal, the portion where the silicon film is exposed is also largely etched when the masking material is removed later, creating steps on the substrate.

The second method is very simple and etching can be easily carried out since the reaction of the masking material with nickel is mild before the crystallizing annealing process. However, because the silicon surface was wholly exposed when the crystallizing annealing was carried out, characteristics of TFT or the like fabricated later degraded.

Although the third method allowed to firmly obtain a good quality crystal silicon film, it was complicated because the number of processes was increased. As a fourth method which was an improved version of the third method, a method comprising steps of putting into a furnace in a state when the silicon surface is exposed, heating for about one hour at 500 to 550° C. initially in an oxygen flow to form a thin silicon oxide film with a thickness of 20 to 60 angstrom thick on the surface and switching to a nitrogen flow as it is was studied as a crystallizing annealing condition. According to this method, an oxide film was formed in the initial stage of the crystallization. And that only the neighbor of the nickel silicide layer had been crystallized in this oxidation stage and a region which would be used for the TFT later (right side portion in the figure) was not crystallized. Due to that, the surface of the silicon film at the region far from the nickel silicide layer 706 was very flat. The characteristics improved more than that of the second method and was almost equal with that of the third method.

The crystal silicon film was thus obtained. Since then, the silicon film 703 was patterned while removing a portion where a value of concentration of nickel was high (a region where the origin of growth was located) and growth points (slanted portions at the end of the arrows in the figure) and while remaining only the region where the concentration of nickel was low. An island silicon region 708 which would be used for an active layer of the TFT was formed as described above. Then a gate insulating film 709 composed of silicon oxide with a thickness of 1200 angstrom was formed covering the region 708 by a plasma CVD method. Further, a gate electrode 710 and a wire, 711 in a first layer were formed by a phosphorus doped silicon film with a thickness of 6000 angstrom and source/drain regions 712 were formed by injecting an impurity into the active layer 708 in a self-aligning manner using the gate electrode 710 as a mask. It was then effective for improving the crystallinity to irradiate visible or near infrared strong light. Further, a silicon oxide film with a thickness of 6000 angstrom was formed by a plasma CVD method as an interlayer insulator 713. Finally, contact holes were created in this interlayer insulator and a wire 714 in a second layer, source/drain electrode and wires 715 were formed by an aluminum film with a thickness of 6000 angstrom. The TFT was completed by the process described above (FIG. 7(E)).

Fifth Embodiment

FIG. 9 shows the present embodiment. In the present embodiment, a polysilicon TFT is formed in a peripheral circuit and an active matrix region of a TFT type liquid crystal display device.

Figure 9A:
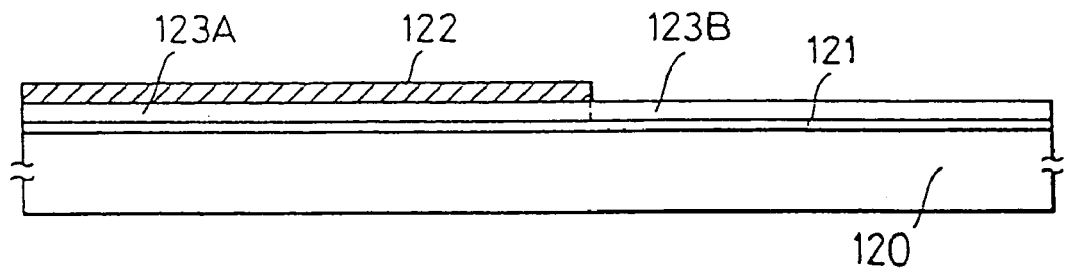
FIGS. 9(A) to 9(C) are section views showing the process of the embodiment.

At first, a ground oxide film 121 was deposited into a thickness of 20 to 200 nm by a sputtering method on a glass substrate 120 having a heat resisting quality such as a silica glass. Further on that, an amorphous silicon film was deposited into a thickness of 30 to 50 nm by a plasma CVD method or vacuum CVD method using mono-silane or di-silane as an original material. Here, a concentration of oxygen or nitrogen in the amorphous silicon film should have been less than $10^{18}$ $cm^{-2}$ or preferably less than $10^{17}$ $cm^{-2}$. The oxygen concentration was set to be less than $10^{17\ cm-2}$ in the present embodiment. A silicon oxide film with a thickness of 100 to 150 nm or silicon nitride film with a thickness of 30 to 100 nm was formed on the amorphous silicon film by a sputtering method as a cover film. It was then patterned to leave a cover film 122 only in the peripheral circuit region. Then it was crystallized by leaving for 4 to 100 hours in an argon or nitrogen atmosphere (600° C.) containing 20 to 100 volume percent of oxygen or hydrogen. As a result, a crystallinity of a silicon film 123A in the peripheral circuit region was good and that of a silicon film 123B in the picture element region was not good. FIG. 9(A) shows this state.

Figure 9B:
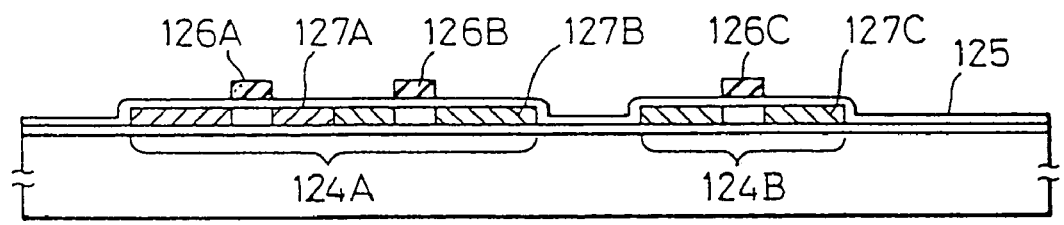

Next, the silicon film was patterned into a shape of island to form a peripheral circuit TFT region 124A and a picture element TFT region 124B as shown in FIG. 9(B). Then a gate oxide film 125 was formed by means of sputtering or the like. It can be formed by a plasma CVD method using TEOS (tetraethoxisilane) instead of the sputtering method. It is desirable to anneal for 0.5 to 3 hours at a temperature more than 650° C. during or after the formation when forming the film using TEOS.

After that, a N-type silicon film with a thickness of 200 nm to 2 micron was formed by LPCVD method and by patterning it, gate electrodes 126A through 126C were formed on each island region. A metallic material having a relatively good heat resistance such as tantalum, chrome, titanium, tungsten and molybdenum may be used instead of the N-type silicon film.

Then, an impurity was injected to the island silicon film of each TFT by an ion doping method in a self-aligning manner using the gate electrode section as a mask. At this time, phosphorus was injected across the whole surface employing phosphine ($PH_3$) as a doping gas at first and after covering the right side of the island region 124A and the matrix region in the figure by a photoresist, boron was injected to the left side of the island region 124A employing diborane ($B_2H_6$) as a doping gas. The dosage of phosphorus was set to be 2 to $8\times10^{15}$ cm$^{-2}$ and that of boron was 4 to $10\times10^{15}$ cm$^{-2}$ so that the dosage of boron would exceed that of phosphorus. A P-type region 127A and N-type regions 127B and 127C were thus created.

It was activated by annealing for 2 to 24 hours at a temperature between 550 and 750° C. The thermal annealing was carried out for 24 hours at 600° C. in the present embodiment. This annealing process activated the region in which ions were injected.

This process can be implemented by laser annealing. Because a thermal damage on the substrate is small when annealed by laser, a normal non-alkaline glass such as Corning 7059 can be used. Further, at that time, a material having an inferior heat resistance such as aluminum can be used as a material for the gate electrode. The P-type region 127A and N-type regions 127B and 127C were created by the process described above. A sheet resistance of those regions was 200 to 800 ohm/sheet.

After that, a silicon oxide film with a thickness of 300 to 1000 nm was formed across the whole surface by a sputtering method as an interlayer insulator 128. This may be a silicon oxide film formed by a plasma CVD method. A silicon oxide film having a good step coverage can be obtained by the plasma CVD method especially using TEOS as an original material.

Figure 9C:
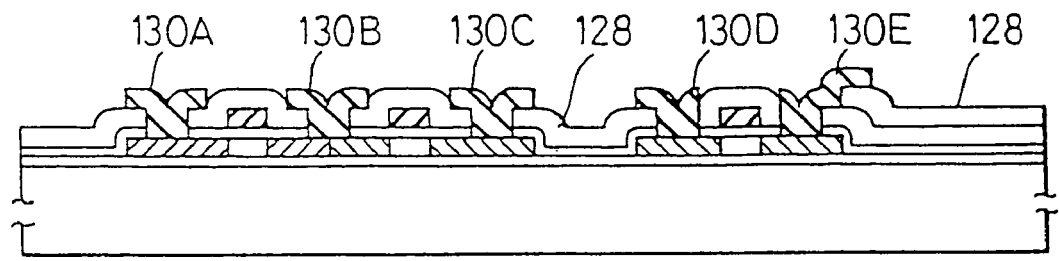

Then an ITO film was created by a Sputtering method and was patterned to form a picture element electrode 129. Contact holes were created in source/drain (impurity regions) of the TFT to form wires 130A through 130E made of chrome or titanium nitride. FIG. 9(C) shows that an inverter circuit have been created by the NTFT and PTFT on the left side. The wires 130A through 130E may be a multi-layered wire with aluminum based on chrome or titanium nitride in order to reduce a sheet resistance. Finally, it was annealed for 0.5 to 2 hours at a temperature between 200 and 350° C. in hydrogen to reduce a dangling bond of the silicon active layer. The peripheral circuit and the active matrix circuit could be integrally created. In the present embodiment, a typical mobility was 80 cm$^2$/Vs in the NMOS, 50 cm$^2$/Vs in the PMOS in the peripheral circuit section and 5 to 30 cm$^2$/Vs in the picture element TFT (NMOS).

Sixth Embodiment

Figure 10A:
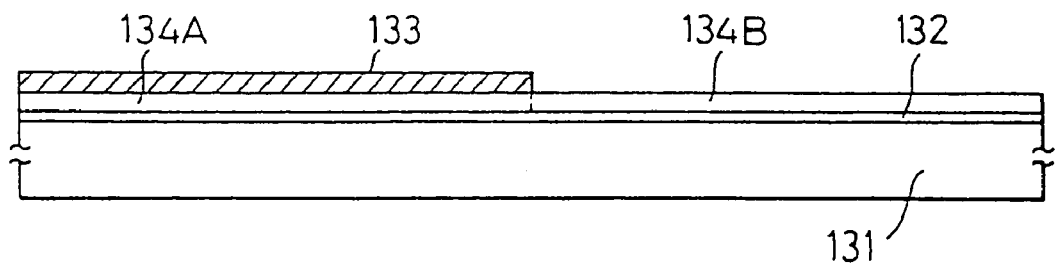
FIGS. 10(A) to 10(C) are section views showing the process of the embodiment.
Figure 10B:
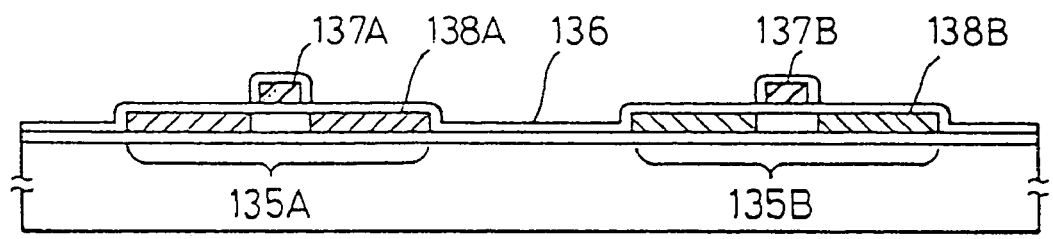
Figure 10C:
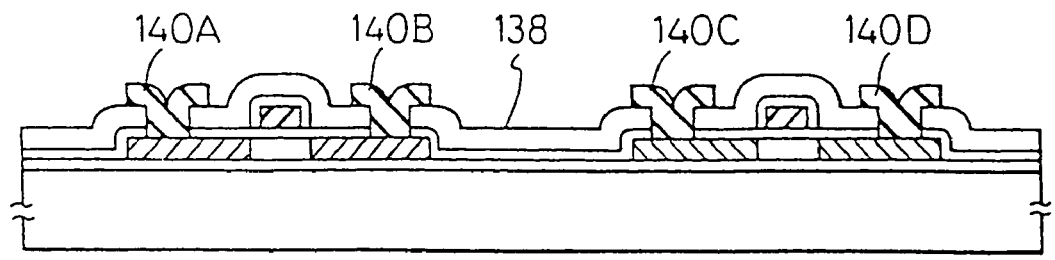

FIG. 10 shows the present embodiment. In the present embodiment, a difference of mobility of NMOS and PMOS is reduced in a CMOS circuit utilizing the present invention. At first, a ground oxide film 132 was deposited into a thickness of 20 to 200 nm by a sputtering method on a Corning 7059 substrate 131. Further on that, an amorphous silicon film was deposited into a thickness of 50 to 250 nm by a plasma CVD method or vacuum CVD method using mono-silane or di-silane as an original material. Here, a concentration of oxygen or nitrogen in the amorphous silicon film should have been less than $10^{18}$ cm$^{-2}$ or preferably less than $10^{17}$ cm$^{-2}$. The vacuum CVD method was suited for this purpose. The oxygen concentration was set to be less than $10^{17}$ cm$^{-2}$ in the present embodiment.

A cover film 133 (a silicon oxide film with a thickness of 50 to 150 nm) was provided on the region of PMOS. Then it was crystallized by annealing for 4 to 100 hours at 600° C. in an argon or nitrogen atmosphere at 600° C. containing more than 50 percent of oxygen or hydrogen. As a result, although a crystallinity of a region 134A under the cover film was good, that of a region 134B where there was no cover film was not good. FIG. 10(A) shows this state.

Next, the silicon film was patterned into a shape of island to form a PMOS region 135A and an NMOS region 135B as shown in FIG. 10(B). Then a silicon oxide film 125 with a thickness of 50 to 150 nm was formed by a sputtering method covering those island regions as a gate insulating film 136. Then an aluminum film was formed with a thickness of 200 nm to 2 micron by a sputtering method, and patterned to form a gate electrode. An anodic oxide film was formed on the upper and side surfaces of the gate electrode by feeding power to it in an electrolyte. Gate electrode sections 137A and 137B were formed on each island region by the process described above.

Then, an impurity was injected to the island silicon film of each TFT by an ion doping method in a self-aligning manner using the gate electrode section as a mask. At this time, phosphorus was injected across the whole surface employing phosphine ($PF_3$) as a doping gas at first and after covering only the island region 135B in the figure by a photoresist, boron was injected to the island region 135A employing diborane ($B_2H_6$) as a doping gas. The dosage of phosphorus was set to be 2 to $8\times10^{15}$ cm$^{-2}$ and that of boron to be 4 to $10\times10^{15}$ cm$^{-2}$ so that the dosage of boron would exceed that of phosphorus.

Although the crystallinity of the silicon film is broken by the doping process, it was possible to keep its sheet resistance around 1 kohm/sheet. However, if the sheet resistance of this degree is to much, the sheet resistance can be lowered by annealing further for 2 to 24 hours at 600° C. The same effect can be obtained by irradiating such a strong light as laser light.

A P-type region 138A and N-type regions 138B were thus created. A sheet resistance of those regions was 200 to 800 ohm/sheet. Then a silicon oxide film with a thickness of 300 to 1000 nm was formed across the whole surface by a sputtering method as an interlayer insulator 139. This may be a silicon oxide film formed by a plasma CVD method. A silicon oxide film having a good step coverage can be obtained by the plasma CVD method especially using TEOS as an original material.

Then contact holes were created in source/drain (impurity regions) of the TFT to form aluminum wires 140A through 140D. Finally, it was annealed for 2 hours at a temperature between 250 and 350° C. in hydrogen to reduce a dangling bond of the silicon film. A typical mobility of the TFT obtained by the process above was 60 cm$^2$/Vs both in the PMOS and NMOS. When a shift resistor was fabricated using the process of the present embodiment, an operation of more than 10 Mhz with 20 V so drain voltage was confirmed.

Seventh Embodiment

FIG. 11 shows the present embodiment. The present embodiment relates to a circuit in which a transistor and silicon resistance are combined. Silicon doped by impurity can be used as a protecting circuit of the transistor. At first, a ground oxide film 141 was deposited into a thickness of 20 to 200 nm by a sputtering method on a Corning 7059 substrate 140. Further on that, an amorphous silicon film 142 was deposited into a thickness of 100 to 250 nm by a plasma CVD method or vacuum CVD method using mono-silane or di-silane as an original material. Here, a concentration of oxygen or nitrogen in the amorphous silicon film should have been less than $10^{18}$ cm$^{-2}$ or preferably less than $10^{17}$ cm$^{-2}$.

Figure 11A:
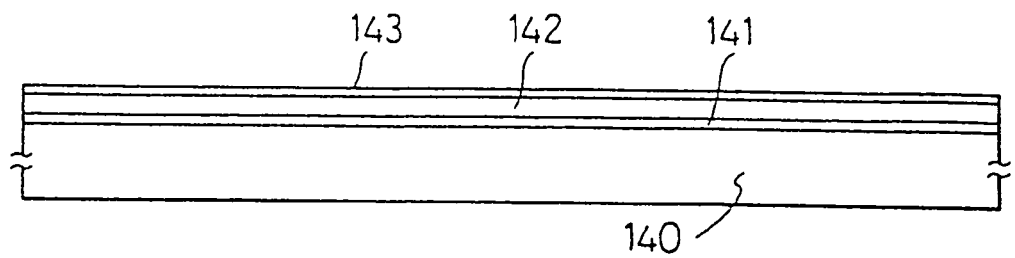
FIGS. 11(A) to 11(D) are section views showing the process of the embodiment.

A cover film 143 of a silicon oxide film with a thickness of 20 to 200 nm was deposited and it was crystallized by annealing for 4 to 100 hours in an argon or nitrogen atmosphere at 600° C. FIG. 11(A) shows this state.

Figure 11B:
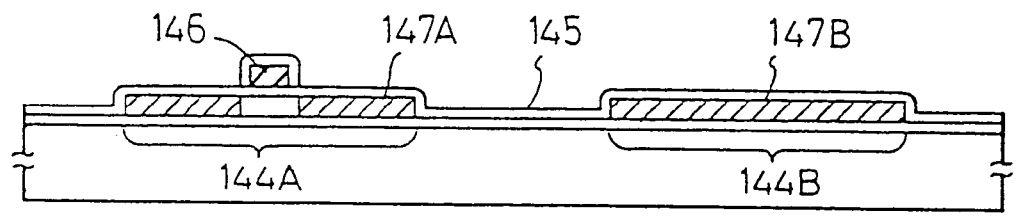

Next, the silicon film was patterned into a shape of island to form a transistor region 144A and a resistance region 144B as shown in FIG. 11(B). Then a silicon oxide film with a thickness of 50 to 150 nm was formed by a sputtering method covering those island regions as a gate insulating film 145. Then an aluminum film was formed with a thickness of 200 nm to 2 micron by a sputtering method, and patterned to form a gate electrode. An anode oxide film was formed on the upper and side surfaces of the gate electrode by feeding power to it in an electrolyte. Gate electrode section 146 was formed on each island region by the process described above.

Then, an impurity, e.g. phosphorus, was injected to the island silicon film of each TFT by an ion doping method in a self-aligning manner using the gate electrode section as a mask. The dosage of phosphorus was 2 to $8 \times 10^{15}$ cm$^{-2}$.

Figure 11C:
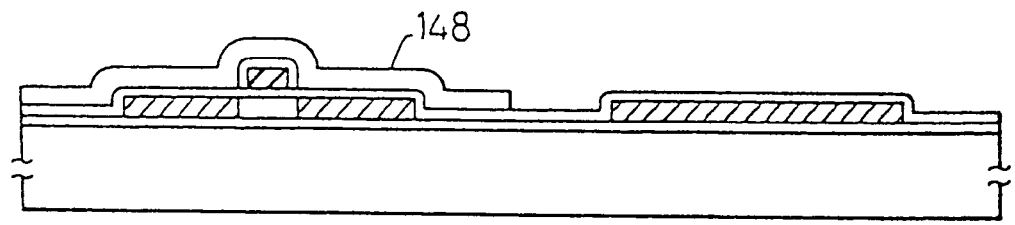
Figure 11D:
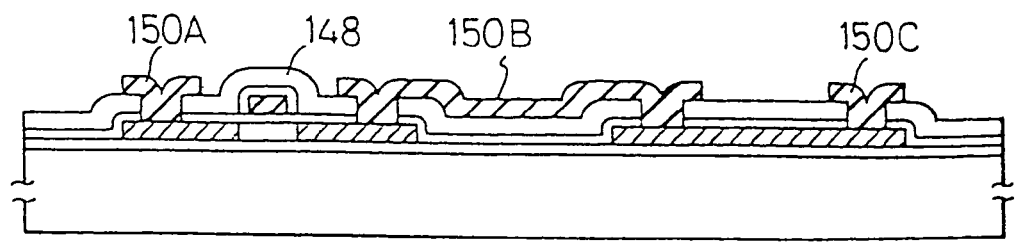

Impurity regions 147A and 147B were created by the doping process described above. Since the same amount of impurity is being injected in those two impurity regions, they show the same resistivity when they are thermally annealed as they are. However, there is a such case for example when a higher resistance is demanded to the latter whereas a lower resistance is always demanded to the former. Then, a cover film 148 of a silicon oxide film with a thickness of 50 to 150 nm was formed only on the transistor region as shown in FIG. 11(C). It was then annealed for 4 to 20 hours at a temperature between 550 and 650° in an argon or nitrogen atmosphere containing more than 50 volume percent of oxygen or hydrogen. Phosphine (PH$_3$) may be used instead so oxygen or hydrogen. However, the annealing temperature is preferable to be less than 800° C. because if the annealing temperature is too high, phosphine is thermally decomposed and diffuses within the semiconductor, lowering the resistivity on the contrary. Diborane (B$_2$H$_6$) may be used when the impurity region of the resistance is P-type.

While a sheet resistance of the impurity region of the transistor was 20 to 800 ohm/sheet, that of the impurity region of the resistance was 2 k to 100 kohm/sheet by the process above. Then a silicon oxide film with a thickness of 300 to 1000 nm was formed across the whole surface by a sputtering method as an interlayer insulator 149. This may be a silicon oxide film formed by a plasma CVD method. A silicon oxide film having a good step coverage can be obtained by the plasma CVD method especially using TEOS as an original material.

Then contact holes were created in source/drain (impurity regions) of the TFT to form aluminum wires 150A through 150C. Finally, it was annealed or 0.5 to 2 hours at a temperature between 250 to 350° C. in hydrogen to reduce a dangling bond of the silicon film. A sheet resistance of the regions which had the same thickness and to which the same amount of impurity was injected could be differentiated by the process described above.

As described above, the present invention is an epoch-making invention in a sense that it promotes the implementation of lower temperature and shorter time crystallization of amorphous silicon and provides an immeasurable benefit to the industry because facility, equipment and technique therefor are very common and are excellent for mass-production. Although the explanation has been made centering on nickel in the aforementioned embodiments, the same process can be applied to another metal element that accelerates the crystallization, i.e. any one of Fe, Co, Ru, Rh, Pd, Os, Ir, Pt, Sc, Ti, V, Cr, Mn, Cu, Zn, Au and Ag.

For example, assuming that it takes two minutes to treat one sheet of substrate, while 15 annealing furnaces were necessary in the conventional solid phase growing method because at least 24 hours of annealing was necessary, the present invention allows to reduce the number of the annealing furnaces to less than ⅙ of that because the annealing time car be shortened to four hours or less. The improvement of productivity and the reduction of amount of investment on facility brought about by that will lead to the drop of substrate processing cost as well as to the drop of a cost of TFTs and thereby to the rise of new demand. Accordingly, the present invention is very beneficial to the industry and deserves to be patented.

Further, the present invention solves the problem in the conventional fabrication process of crystalline silicon TFTs by such minimum modification of the crystallization condition of active layer of the TFTs that whether a cover film exists or not.

The present invention allowed to improve especially a reliability and performance of a dynamic circuit and of a device having such circuit. Conventionally, although crystalline silicon TFTs had low an ON/OFF ratio for such purpose as an active matrix of a liquid crystal display and was difficult in various ways to put it into practical use, such problems have been considered to be solved by the present invention. Although not shown in the embodiments, it will be apparent that the present invention will be effective, when implemented, in TFTs used as means for implementing a stereo-monocrystal semiconductor integrated circuit.

For example, a memory elements section can be constructed by constructing a peripheral logic circuit by semiconductor circuits on a monocrystal semiconductor and by providing TFTs on that through the intermediary of an interlayer insulator. In this case, the memory elements section can be a DRAM circuit using the TFTs of the present invention and its driving circuit is constructed by being CMOS-implemented to the monocrystal semiconductor circuit. Furthermore, when such circuit is used for a microprocessor, its area can be saved because the memory section is raised to the upstairs. Thus the present invention is considered to be a very beneficial invention to the industry.

While the present invention has been particularly shown and described with reference to preferred embodiments thereon, it will be understood by those skilled in the art that the foregoing and other changes in form and details can be made therein without departing from the spirit and scope of the invention.

What is claimed is:

1. A method for manufacturing a semiconductor device comprising:

forming a first semiconductor film in a peripheral circuit region and a second semiconductor film in a pixel region over a substrate;

forming a gate insulating film over the first semiconductor film and the second semiconductor film;

forming a first gate electrode and a second gate electrode over the first semiconductor film and the gate insulating film, and a third gate electrode over the second semiconductor film and the gate insulating film;

forming a pair of first impurity regions and a pair of second impurity regions in the first semiconductor film, wherein one of the pair of first impurity regions is in physical contact with one of the pair of second impurity regions;

forming a pair of third impurity regions in the second semiconductor film; and forming a wiring electrically connected to the one of the pair of first impurity regions and the one of the pair of second impurity regions.

2. A method for manufacturing a semiconductor device according to claim 1, wherein the pair of first impurity regions comprise phosphorus.

3. A method for manufacturing a semiconductor device according to claim 1, wherein the pair of second impurity regions comprise boron.

4. A method for manufacturing a semiconductor device according to claim 1, further comprising a step of irradiating the first semiconductor film with a laser light after forming the pair of first impurity regions and the pair of second impurity regions.

5. A method for manufacturing a semiconductor device according to claim 1, further comprising a step of forming an interlayer insulator over the first gate electrode and the second gate electrode.

6. A method for manufacturing a semiconductor device according to claim 1, wherein the pair of third impurity regions comprise phosphorus.

7. A method for manufacturing a semiconductor device comprising:

forming a first semiconductor film in a peripheral circuit region and a second semiconductor film in a pixel region over a substrate;

forming a pair of first impurity regions and a pair of second impurity regions in the first semiconductor film, wherein one of the pair of first impurity regions is in physical contact with one of the pair of second impurity regions;

forming a pair of third impurity regions in the second semiconductor film; and forming a wiring electrically connected to the one of the pair of first impurity regions and the one of the pair of second impurity regions.

8. A method for manufacturing a semiconductor device according to claim 7, wherein the pair of first impurity regions comprise phosphorus.

9. A method for manufacturing a semiconductor device according to claim 7, wherein the pair of second impurity regions comprise boron.

10. A method for manufacturing a semiconductor device according to claim 7, further comprising a step of irradiating the first semiconductor film with a laser light after forming the pair of first impurity regions and the pair of second impurity regions.

11. A method for manufacturing a semiconductor device according to claim 7, further comprising a step of forming an interlayer insulator over the first semiconductor film and the second semiconductor film.

12. A method for manufacturing a semiconductor device according to claim 7, wherein the pair of third impurity regions comprise phosphorus.

13. A method for manufacturing a semiconductor device comprising:

forming a first semiconductor film in a peripheral circuit region and a second semiconductor film in a pixel region over a substrate;

forming a gate insulating film over the first semiconductor film and the second semiconductor film;

forming a first gate electrode and a second gate electrode over the first semiconductor film and the gate insulating film, and a third gate electrode over the second semiconductor film and the gate insulating film;

selectively doping a N-type impurity into the first semiconductor film and the second semiconductor film;

covering the second semiconductor film and a portion of the first semiconductor film by a photoresist;

selectively doping a P-type impurity into a portion of the first semiconductor film which is not covered by the photoresist, whereby a pair of first impurity regions and a pair of second impurity regions are formed in the first semiconductor film and a pair of third impurity regions are formed in the second semiconductor film, and one of the pair of first impurity regions is in physical contact with one of the pair of second impurity regions; and forming a wiring electrically connected to the one of the pair of first impurity regions and the one of the pair of second impurity regions.

14. A method for manufacturing a semiconductor device according to claim 13, wherein the pair of first impurity regions comprise phosphorus.

15. A method for manufacturing a semiconductor device according to claim 13, wherein the pair of second impurity region comprise boron.

16. A method for manufacturing a semiconductor device according to claim 13, further comprising a step of irradiating the first semiconductor film with a laser light after forming the pair of first impurity regions and the pair of second impurity regions.

17. A method for manufacturing a semiconductor device according to claim 13, further comprising a step of forming an interlayer insulator over the first gate electrode and the second gate electrode.

18. A method for manufacturing a semiconductor device according to claim 13, wherein the pair of third impurity regions comprise phosphorus.

19. A method for manufacturing a semiconductor device comprising:

forming a first semiconductor film in a peripheral circuit region and a second semiconductor film in a pixel region over a substrate;

selectively doping a N-type impurity into the first semiconductor film and the second semiconductor film, covering the second semiconductor film and a portion of the first semiconductor film by a photoresist, selectively doping a P-type impurity into a portion of the first semiconductor film which is not covered by the photoresist, whereby a pair of first impurity regions and a pair of second impurity regions are formed in the first semiconductor film and a pair of third impurity regions are formed in the second semiconductor film, and one of the pair of first impurity regions is in physical contact with one of the pair of second impurity regions, and forming a wiring electrically connected to the one of the pair of first impurity regions and the one of the pair of second impurity regions.

20. A method for manufacturing a semiconductor device according to claim 19, wherein the pair of first impurity regions comprise phosphorus.

21. A method for manufacturing a semiconductor device according to claim 19, wherein the pair of second impurity regions comprise boron.

22. A method for manufacturing a semiconductor device according to claim 19, further comprising a step of irradiating the first semiconductor film with a laser light after forming the pair of first impurity regions and the pair of second impurity regions.

23. A method for manufacturing a semiconductor device according to claim 19, further comprising a step of forming an interlayer insulator over the first semiconductor film and the second semiconductor film.

24. A method for manufacturing a semiconductor device according to claim 19, wherein the pair of third impurity regions comprise phosphorus.

* * * * *